(12) United States Patent
Na et al.

(10) Patent No.: US 11,784,081 B2
(45) Date of Patent: Oct. 10, 2023

(54) MICRO DEVICE TRANSFER APPARATUS AND METHOD

(71) Applicant: Samsung Display Co., Ltd., Yongin-Si (KR)

(72) Inventors: Heung Yeol Na, Suwon-si (KR); Kang Won Lee, Gumi-si (KR); Yoon Jae Lee, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 17/515,159

(22) Filed: Oct. 29, 2021

(65) Prior Publication Data

US 2022/0051925 A1 Feb. 17, 2022

Related U.S. Application Data

(62) Division of application No. 16/909,956, filed on Jun. 23, 2020, now Pat. No. 11,195,742.

(30) Foreign Application Priority Data

Jul. 22, 2019 (KR) .................. 10-2019-0088306

(51) Int. Cl.
*H01L 21/683* (2006.01)
*H01L 21/67* (2006.01)
(Continued)

(52) U.S. Cl.
CPC ........ *H01L 21/6835* (2013.01); *B25J 9/0087* (2013.01); *B25J 9/026* (2013.01);
(Continued)

(58) Field of Classification Search
CPC .......... H01L 21/6835; H01L 21/67144; H01L 25/0753; H01L 33/62; H01L 2221/68354;
(Continued)

(56) References Cited

U.S. PATENT DOCUMENTS 10,096,740 B1 * 10/2018 Chen .................. H01L 33/36
10,163,869 B2 12/2018 Zou et al.
(Continued)

FOREIGN PATENT DOCUMENTS

JP 2010-251360 A 11/2010
KR 10-1619466 B1 5/2016

*Primary Examiner* — Vu A Vu
(74) *Attorney, Agent, or Firm* — Innovation Counsel LLP

(57) ABSTRACT

A micro device transfer apparatus and a micro device transfer method are provided. The micro device transfer apparatus comprises a stage unit including a stage where a target substrate is to be disposed, a plurality of transfer head units disposed above the stage, and a transfer head unit moving part configured to move the plurality of transfer head units, wherein, the transfer head unit comprises a carrier substrate fastening part configured to fasten a carrier substrate where a plurality of micro devices are disposed, a mask unit disposed above the carrier substrate fastening part, the mask unit comprising a mask including an opening part and a shielding part, a light emitting part disposed on the mask unit, and a housing formed around the carrier substrate fastening part, the mask unit, and the light emitting part.

8 Claims, 24 Drawing Sheets

HD1

(51) Int. Cl.
*H01L 25/075* (2006.01)
*H01L 33/62* (2010.01)
*B25J 15/00* (2006.01)
*B25J 9/00* (2006.01)
*B25J 9/02* (2006.01)

(52) U.S. Cl.
CPC .... *B25J 15/0052* (2013.01); *H01L 21/67144* (2013.01); *H01L 25/0753* (2013.01); *H01L 33/62* (2013.01); *H01L 2221/68354* (2013.01); *H01L 2221/68363* (2013.01); *H01L 2933/0066* (2013.01)

(58) Field of Classification Search
CPC .... H01L 2221/68363; H01L 2933/0066; B25J 9/0087; B25J 9/026; B25J 15/0052
USPC .......................................................... 438/28
See application file for complete search history.

(56) References Cited

U.S. PATENT DOCUMENTS

| | | | |
|---|---|---|---|
| 10,340,262 B2* | 7/2019 | Kajiyama | H01L 25/50 |
| 10,638,650 B2 | 4/2020 | Hirakawa et al. | |
| 10,840,115 B2 | 11/2020 | Ahn et al. | |
| 10,937,768 B2* | 3/2021 | Takeya | H01L 21/67144 |
| 11,133,295 B2* | 9/2021 | Liu | H01L 24/81 |
| 11,195,742 B2* | 12/2021 | Na | B25J 15/0052 |
| 2006/0225273 A1* | 10/2006 | Arneson | H01L 24/81 29/740 |
| 2017/0064884 A1* | 3/2017 | Kim | H05K 13/0404 |
| 2017/0263837 A1* | 9/2017 | Jeon | H01L 33/54 |
| 2018/0067397 A1 | 3/2018 | Aoki | |
| 2018/0356739 A1 | 12/2018 | Aoki et al. | |
| 2018/0368298 A1 | 12/2018 | Kawai | |
| 2019/0043843 A1* | 2/2019 | Liu | H01L 25/0753 |
| 2019/0103274 A1* | 4/2019 | Chang | H01L 27/156 |
| 2019/0267426 A1* | 8/2019 | Zou | H01L 27/153 |
| 2019/0384179 A1* | 12/2019 | Aoki | G03F 7/70358 |
| 2021/0005520 A1* | 1/2021 | Ishio | H01L 21/67271 |

* cited by examiner

FIG. 5
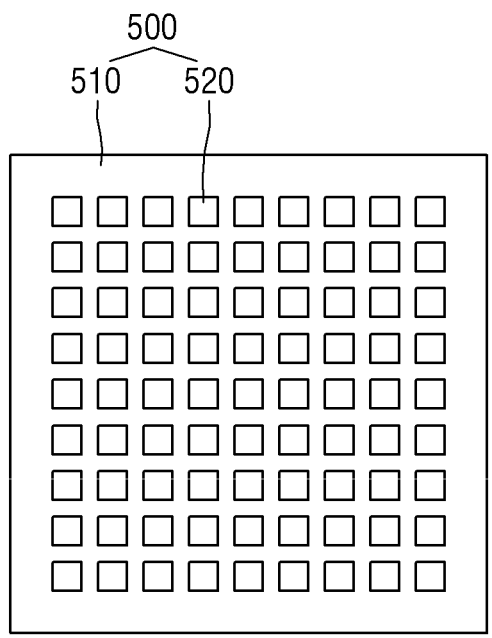
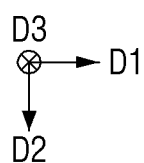

FIG. 12
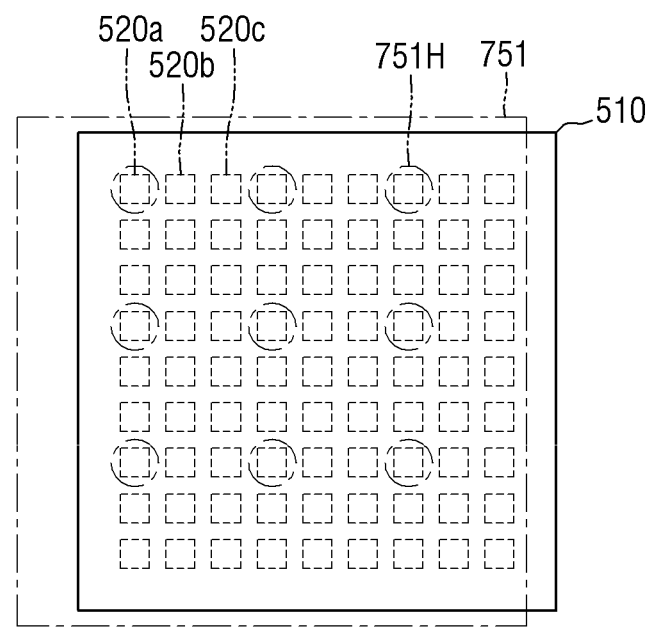
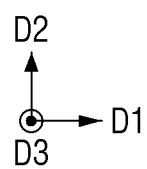

FIG. 17
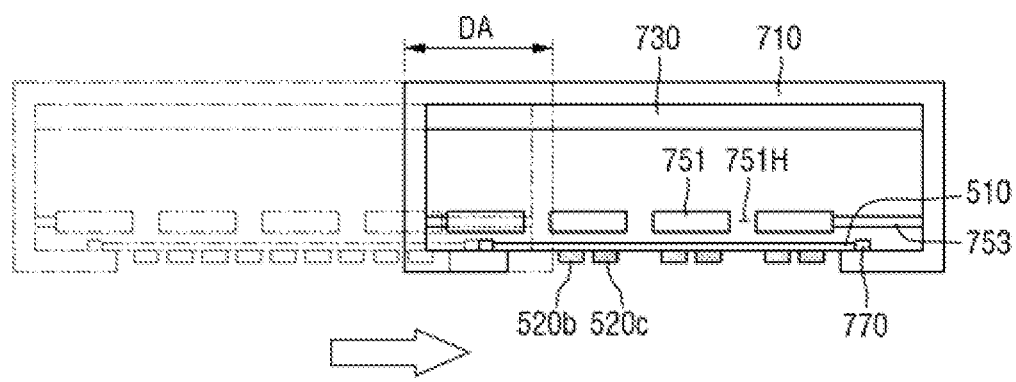
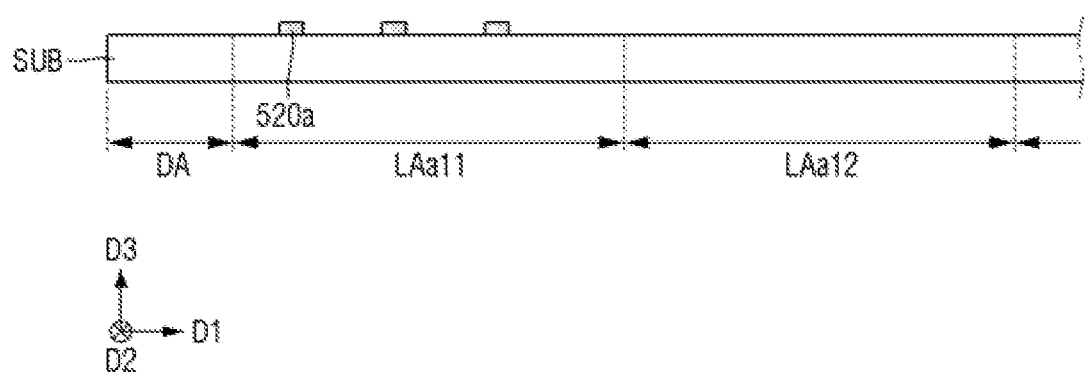
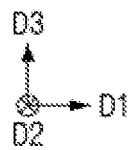

FIG. 18
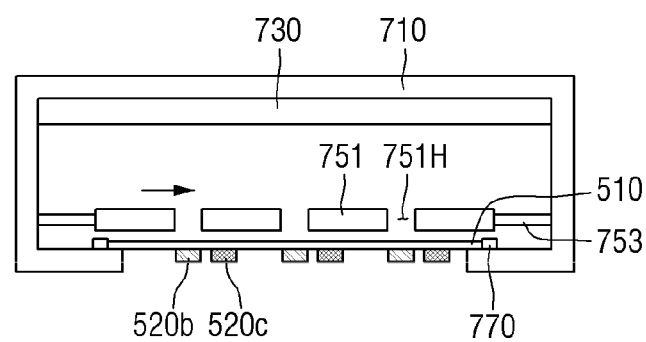
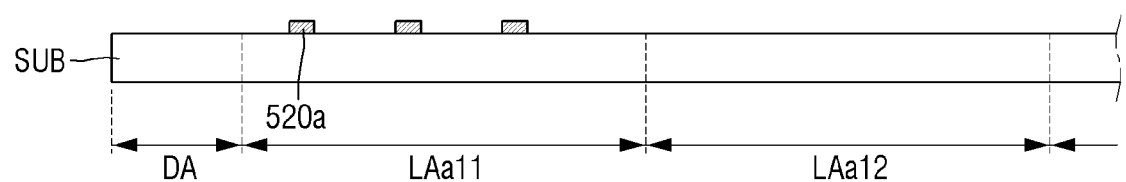
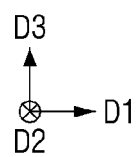

MICRO DEVICE TRANSFER APPARATUS AND METHOD

CROSS-REFERENCE TO RELATED APPLICATION(S)

This application is a divisional application of U.S. patent application Ser. No. 16/909,956 filed on Jun. 23, 2020, which claims priority under 35 USC § 119 to Korean Patent Application No. 10-2019-0088306 filed on Jul. 22, 2019, in the Korean Intellectual Property Office, the disclosures of which are incorporated herein in their entirety by reference.

BACKGROUND

1. Field of the Disclosure

The present disclosure relates to a micro device transfer apparatus and method. Particularly, the present disclosure relates to a micro device transfer apparatus and method capable of transferring a plurality of micro devices from a carrier substrate to a target substrate.

2. Description of the Related Art

With the advancement of the information age, a demand for a display device for displaying an image has been increased in various forms. For example, such a display device is applied to various electronic devices such as a smartphone, a digital camera, a notebook computer, a navigation device, and a smart television. Recently, as the demand for large-size display devices increases, substrates and backlight units increase in size. Accordingly, research has been actively conducted on a micro device transfer apparatus and method that have excellent transfer efficiency when a plurality of micro devices are transferred to a large-scale substrate.

SUMMARY

Aspects of the present disclosure provide a micro device transfer apparatus capable of selectively and/or quickly transferring a plurality of micro devices from a carrier substrate to a target substrate.

Aspects of the present disclosure also provide a micro device transfer method capable of efficiently transferring a plurality of micro devices disposed on a carrier substrate onto a target substrate.

It should be noted that objects of the present disclosure are not limited to the above-described objects, and other objects of the present disclosure will be apparent to those skilled in the art from the following descriptions.

According to an example embodiment of the disclosure, a micro device transfer apparatus, includes a stage unit including a stage where a target substrate is to be disposed, a plurality of transfer head units disposed above the stage, and a transfer head unit moving part configured to move the transfer head unit, wherein, the plurality of transfer head units includes a carrier substrate fastening part configured to fasten a carrier substrate where a plurality of micro devices are disposed, a mask unit disposed above the carrier substrate fastening part, the mask unit including a mask including an opening part and a shielding part, a light emitting part disposed on the mask unit, and a housing formed around the carrier substrate fastening part, the mask unit, and the light emitting part.

In an example embodiment, the opening part of the mask unit exposes some of the plurality of micro devices disposed on the carrier substrate fastened to the carrier substrate fastening part, and the shielding part of the mask unit shields a rest of the plurality of micro devices except for the micro devices exposed by the opening part.

In an example embodiment, the light emitting part emits active light to the carrier substrate through the mask unit.

In an example embodiment, the micro device transfer apparatus, further includes a gantry frame which is disposed above the stage and on which the transfer head unit is mounted.

In an example embodiment, the micro device transfer apparatus, further includes a transfer head unit moving module configured to move the transfer head unit along the gantry frame as a first moving module installed on the gantry frame.

In an example embodiment, the micro device transfer apparatus, further includes a support disposed outside the stage and configured to support the gantry frame, wherein, the support includes a vertical support part extending in a third direction, and a horizontal support part connected to the vertical support part and extending in a second direction, wherein the gantry frame is movably connected to the horizontal support part, the gantry frame extends in a first direction, and the horizontal support part extends in the second direction intersecting the first direction.

In an embodiment, the micro device transfer apparatus, further including a gantry frame moving module configured to move the gantry frame in the second direction.

In an example embodiment, the transfer head unit comprises a first transfer head unit and a second transfer head unit which are spaced apart from each other on the gantry frame.

In an example embodiment, the plurality of transfer head units further comprises a third transfer head unit and a fourth transfer head unit, the gantry frame comprises a first gantry frame and a second gantry frame which are spaced apart from each other, the first gantry frame is a gantry frame on which the first transfer head unit and the second transfer head unit are mounted, and the third transfer head unit and the fourth transfer head unit are spaced apart from each other on the second gantry frame.

In an example embodiment, each of the plurality of transfer head units has a smaller planar area than the planar area of the stage.

According to an example embodiment of the disclosure, a micro device transfer method, includes preparing a micro device/carrier substrate laminate including a plurality of micro devices attached onto a carrier substrate, and a first separation step of placing a mask including an opening part and a shielding part at a first location on the micro device/carrier substrate laminate and emitting first active light to separate some of the micro devices to which the active light is emitted through the opening part from the carrier substrate.

In an example embodiment, the micro device transfer method, further includes attaching the micro devices separated through the first separation step to a first region of a target substrate.

In an example embodiment, the micro device transfer method, further includes after the first separation step, a second separation step of placing the mask at a second location different from the first location and emitting, second active light to separate some of the micro devices to which the active light is emitted through the opening part from the carrier substrate.

In an example embodiment, the micro device transfer method, further includes attaching the micro devices separated through the second step operation to a second region different from the first region of the target substrate.

In an example embodiment, the micro device/carrier substrate laminate further comprises an adhesive film disposed between the carrier substrate and the plurality of micro devices, and the adhesive film has adhesion weakened by the first active light.

In an example embodiment, the micro device transfer method, further includes before the first separation step, fastening the micro device/carrier substrate laminate to a carrier substrate fastening part of a transfer head unit.

In an example embodiment, the transfer head unit comprises a first transfer head unit and a second transfer head unit.

In an example embodiment, the transfer head unit is mounted on a gantry frame.

In an example embodiment, after the first separation step, the transfer head unit is moved from a first region of a target substrate on which the first separation step is performed to a second region different from the first region along the gantry frame.

According to an embodiment, by transferring a plurality of micro devices onto a target substrate using a micro device transfer apparatus including a plurality of transfer head units, it is possible to shorten work time. Also, by a plurality of transfer head units transferring a plurality of micro devices onto a plurality of regions of a target substrate, it is possible to efficiently transfer micro devices onto a large-scale target substrate.

The present disclosure is not limited to the above-described advantageous effects, and other various effects are included in this specification.

BRIEF DESCRIPTION OF THE DRAWINGS

The above and other aspects and features of the present disclosure will become more apparent by describing in detail example embodiments thereof with reference to the attached drawings, in which:

FIG. 5 is a bottom view of a carrier substrate magazine of FIG. 4;

FIG. 12 is a layout diagram showing relative placement of a mask and a micro device/carrier substrate laminate of FIG. 11;

FIGS. 14, 15, 16, 17, 18, and 19 are schematic diagrams showing a micro device transfer method;

DETAILED DESCRIPTION OF THE EMBODIMENTS

The present disclosure will now be described more fully hereinafter with reference to the accompanying drawings, in which preferred embodiments of the invention are shown. This disclosure may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

In concluding the detailed description, those skilled in the art will appreciate that many variations and modifications can be made to the preferred embodiments without substantially departing from the principles of the present disclosure. Therefore, the disclosed preferred embodiments of the present disclosure are used in a generic and descriptive sense only and not for purposes of limitation.

Hereinafter, example embodiments will be described with reference to the accompanying drawings.

Figure 1:
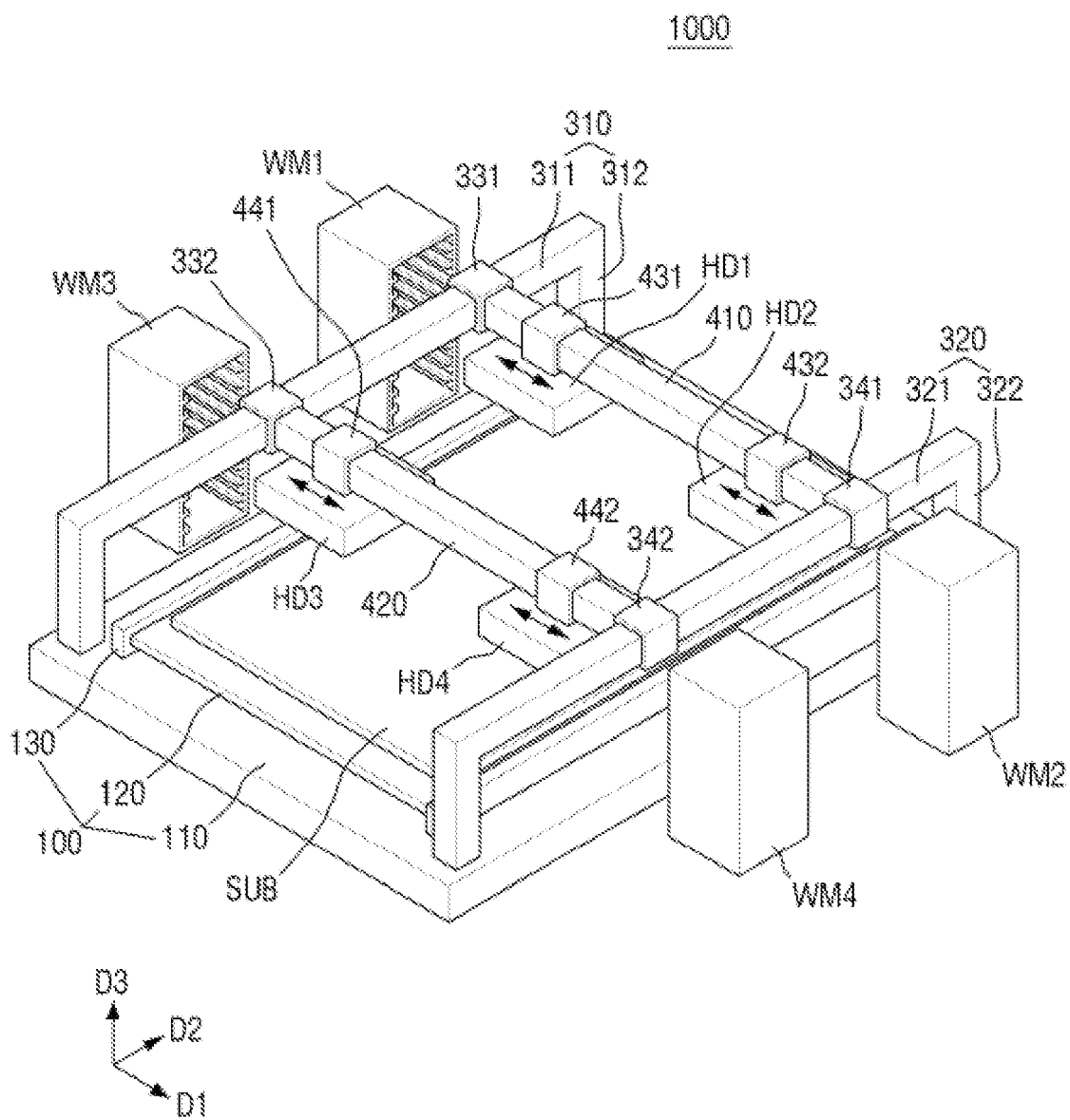
FIG. 1 is a perspective view of a micro device transfer apparatus according to an embodiment.
Figure 2:
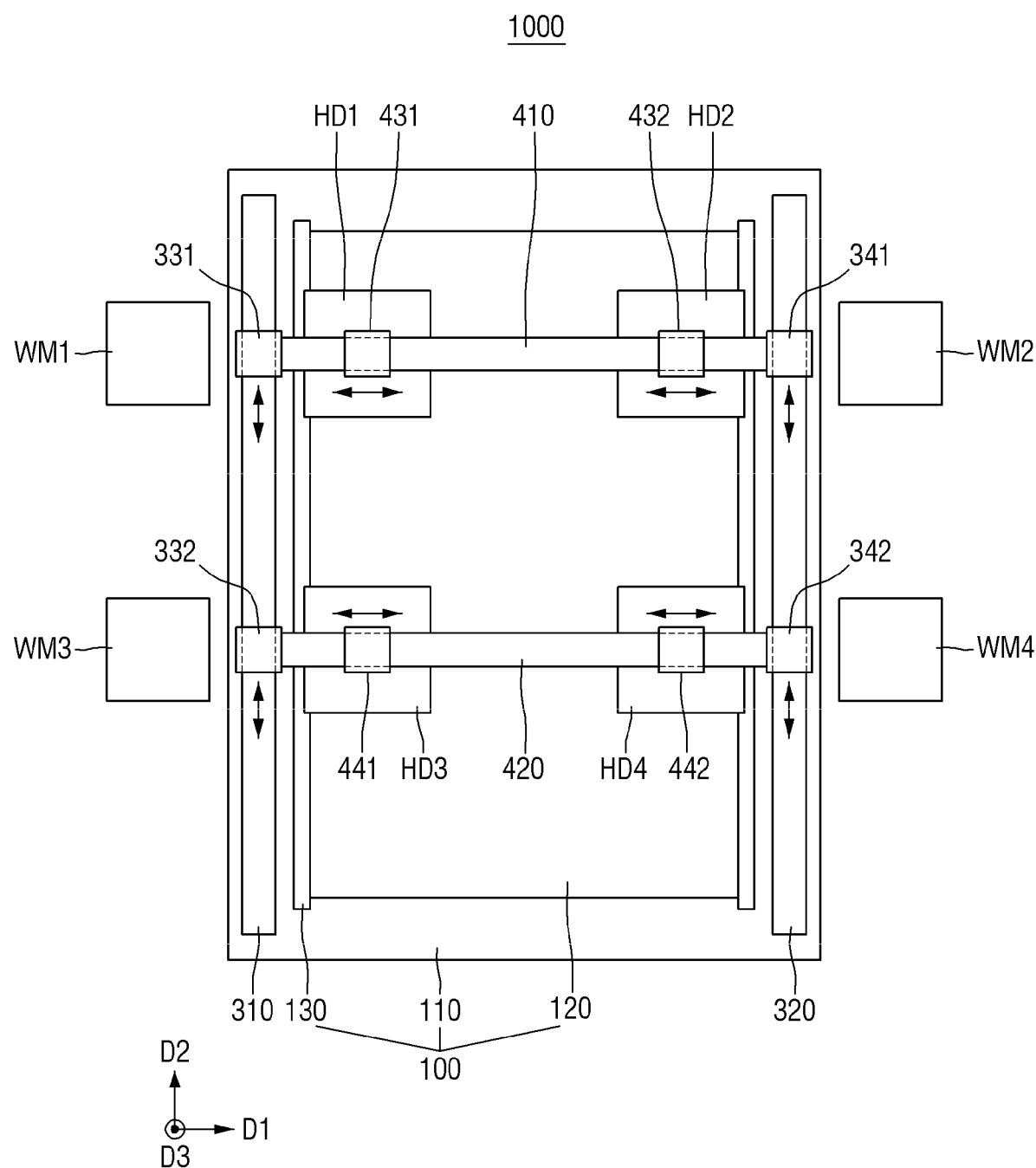
FIG. 2 is a top plan view of a micro device transfer apparatus according to an embodiment.
Figure 3:
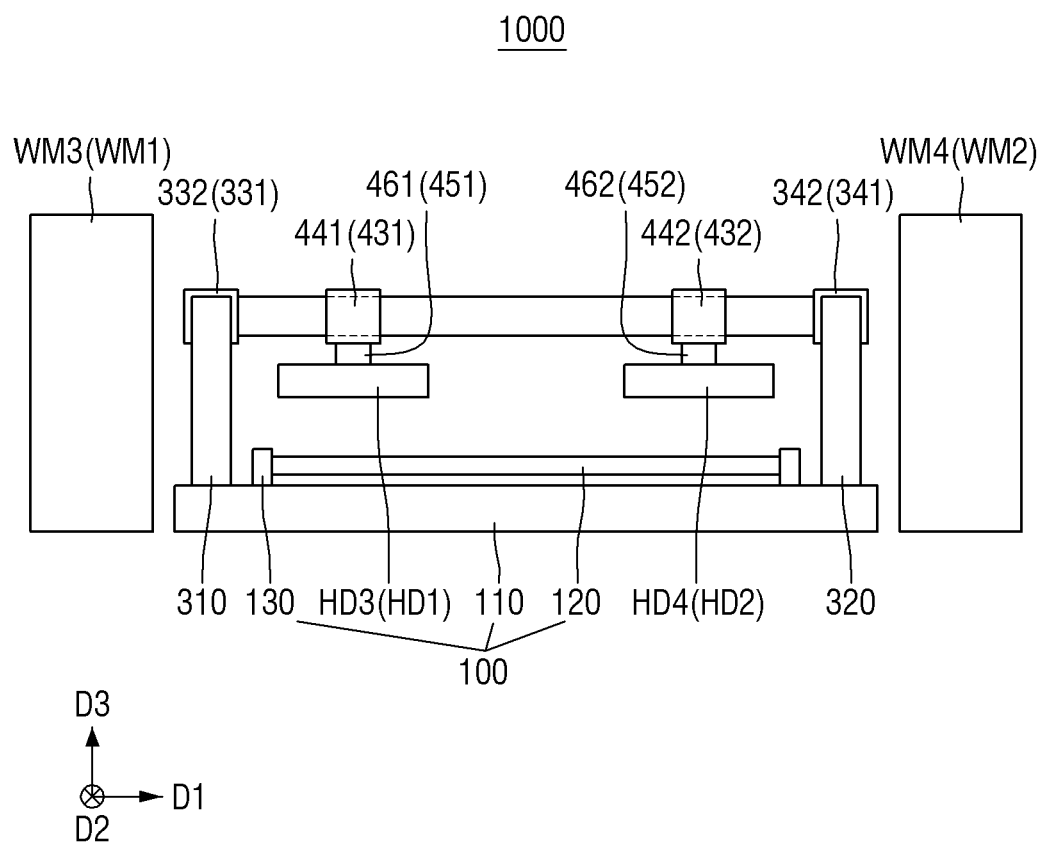
FIG. 3 is a front view of a micro device transfer apparatus according to an embodiment.

FIG. 1 is a perspective view of a micro device transfer apparatus according to an embodiment. FIG. 2 is a top plan view of the micro device transfer apparatus according to an embodiment. FIG. 3 is a front view of the micro device transfer apparatus according to an embodiment.

In the drawings, a first direction D1, a second direction D2, and a third direction D3 are defined. The first direction D1 and the second direction D2 are horizontal, coplanar, and orthogonal to each other, and the third direction D3 is vertical to the first direction D1 and the second direction D2, respectively.

Referring to FIGS. 1, 2, and 3, a micro device transfer apparatus 1000 according to an embodiment may include a stage unit 100, a plurality of transfer head units HD1, HD2, HD3, and HD4 spaced apart above the stage unit 100 (in the third direction D3), supports 310 and 320, and gantry frames 410 and 420. The micro device transfer apparatus 1000 may further include gantry frame moving modules 331, 332, 341, and 342 and a transfer head unit moving part.

The stage unit 100 may include a base frame 110, a stage 120 disposed on the base frame 110, and a stage moving part 130.

The stage 120 provides a space where a target substrate SUB is to be disposed. The target substrate SUB may be seated above the stage 120 (in the third direction D3) for the purpose of a micro device transfer process. A substrate aligner (not shown here) may be further installed above the stage 120 to align the target substrate SUB.

The overall planar shape of the stage 120 may follow the planar shape of the target substrate SUB. For example, the overall shape of the stage 120 may be rectangular when the target substrate SUB is rectangular and may be circular when the target substrate SUB is circular. In these drawings, the stage 120 is illustrated as having a rectangular shape with long sides disposed in the second direction D2 and short sides disposed in the first direction D1.

The stage moving part 130 serves to supply the target substrate SUB to the micro device transfer apparatus 1000 or to discharge the target substrate SUB in which a plurality of micro devices are disposed. The stage 120 may be fastened by the stage moving part 130. The stage moving part 130 may be installed on the base frame 110, and the stage 120 may be moved by the stage moving part 130. For example, the stage moving part 130 may move the stage 120 in the second direction D2.

The supports 310 and 320 may include a first support 310 disposed on a first long side of the stage unit 100 and a second support 320 disposed on a second long side of the stage unit 100 opposite to the first long side. Accordingly, the first support 310 and the second support 320 may be spaced apart from each other in the first direction D1. The stage 120 may be disposed between the first support 310 and the second support 320. Accordingly, the first support 310 and the second support 320 may be externally disposed to be adjacent to the stage 120 in the first direction D1.

As depicted in FIG. 1, the first support 310 may include a first horizontal support part 311 extending in the second direction D2 and a first vertical support part 312 connected to both ends of the first horizontal support part 311 and extending in the third direction D3, which is the vertical direction. The first vertical support part 312 may have an end placed on the base frame 110. The cross-sectional shape of the first support 310 is a rectangular, but the cross-sectional shape is not particularly limited.

The second support 320 may include a second horizontal support part 321 extending in the second direction D2 and a second vertical support part 322 connected to both ends of the second horizontal support part 321 and extending in the third direction D3, which is the vertical direction. The second vertical support part 322 may have an end placed on the base frame 110. The cross-sectional shape of the second support 320 is a rectangular, but the cross-sectional shape is not particularly limited.

The gantry frames 510 and 520, which will be described below, are movably connected to the first horizontal support part 311 of the first support 310 and the second horizontal support part 321 of the second support 320, and the first support 310 and the second support 320 serve to support the gantry frames 510 and 520.

The gantry frames 510 and 520 are disposed above the stage 120. The gantry frames 510 and 520 may be disposed between the first support 310 and the second support 320. As described above, the gantry frames 510 and 520 may be movably connected to the first horizontal support part 311 of the first support 310 and the second horizontal support part 321 of the second support 320.

The gantry frames 410 and 420 may include a first gantry frame 410 and a second gantry frame 420.

The first gantry frame 410 is disposed between the first support 310 and the second support 320. The first gantry frame 410 may be connected to the first horizontal support part 311 of the first support 310 and the second horizontal support part 321 of the second support 320. The second gantry frame 420 is disposed between the first support 310 and the second support 320. The second gantry frame 420 may be connected to the first horizontal support part 311 of the first support 310 and the second horizontal support part 321 of the second support 320. Accordingly, the distance from the first gantry frame 410 and the second gantry frame 420 to the base frame 110 in the third direction D3 may be equal to the distance from the first horizontal support part 311 and the second support 320 to the base frame 110 in the third direction D3.

The first gantry frame 410 may have a rectangular cross-sectional shape extending in the first direction D1. The second gantry frame 420 may have a rectangular cross-sectional shape extending in the first direction D1. Accordingly, the extending direction of the first gantry frame 410 and the second gantry frame 420 may be equal to the first direction D1, i.e., the short side direction of the stage unit 100. In an example embodiment, the first gantry frame 410 and the second gantry frame 420 may be located parallel to and spaced apart from each other in the first direction D1. The lengths of the first gantry frame 410 and the second gantry frame 420 extending in the first direction D1 may be equal to each other.

As depicted in FIG. 2, a plurality of transfer head units HD may include a first transfer head unit HD1, a second transfer head unit HD2, a third transfer head unit HD3, and a fourth transfer head unit HD4. The plurality of transfer head units HD1, HD2, HD3, and HD4 are disposed above the stage 120. The plurality of transfer head units HD1, HD2, HD3, and HD4 may be mounted on the gantry frames 410 and 420. At least one of the transfer head units HD1, HD2, HD3, and HD4 may be mounted on the gantry frames 410 and 420.

Each transfer head unit HD serves to place a plurality of micro devices 520 (see FIG. 4) onto the target substrate SUB. Each transfer head unit HD1, HD2, HD3, and HD4 may be spaced a predetermined distance corresponding to the height of the vertical support parts 312 and 322 of the supports 310 and 320 from the stage 120.

Each transfer head unit HD1, HD2, HD3, and HD4 may be arranged in a plurality of rows along the extending direction of the gantry frames 410 and 420. Each transfer head unit HD1, HD2, HD3, and HD4 may be arranged apart from each other on the gantry frames 410 and 420. For example, the first transfer head unit HD1 and the second transfer head unit HD2 may be mounted apart from each other on the first gantry frame 410. Also, the third transfer head unit HD3 and the fourth transfer head unit HD4 may be mounted apart from each other on the second gantry frame 420. However, each transfer head unit HD1, HD2, HD3, and HD4 may have a different arrangement direction and arrangement shape depending on the extending direction of and/or the number of gantry frames 410 and 420. By the plurality of transfer head units HD1, HD2, HD3, and HD4 being arranged apart from each other, it is possible to prevent the collision of the transfer head units HD1, HD2, HD3, and HD4 while the micro device transfer apparatus 1000 is driven.

The planar shape of each transfer head unit HD1, HD2, HD3, and HD4 may have a square. The transfer head units HD1, HD2, HD3, and HD4 may have the same size. However, the transfer head units HD1, HD2, HD3, and HD4 may have different sizes depending on the partitioning of a transfer region LA (see FIG. 10) of the target substrate SUB. The planar area of each transfer head unit HD1, HD2, HD3, and HD4 may be smaller than the planar area of the target substrate SUB, which will be described below.

The first gantry frame 410 and the second gantry frame 420 may be moved in the horizontal direction by a gantry frame moving module. The horizontal direction in which the first gantry frame 410 and the second gantry frame 420 move may be equal to the second direction D2, which is the long side direction of the stage unit 100. As depicted in FIG. 1, the gantry frame moving module may include a first gantry frame moving module 331, a second gantry frame moving module 332, a third gantry frame moving module 341, and a fourth gantry frame moving module 342.

The first gantry frame moving module 331 and the third gantry frame moving module 341 may be disposed at both ends of the first gantry frame 410. The first gantry frame moving module 331 may be installed on the first horizontal support part 311 of the first support 310, and the third gantry frame moving module 341 may be installed on the second horizontal support part 321 of the second support 320. The first gantry frame moving module 331 and the third gantry frame moving module 341 may be disposed at both ends of the first gantry frame 410 to move the first gantry frame 410 in the second direction D2.

The second gantry frame moving module 332 and the fourth gantry frame moving module 342 may be disposed at both ends of the second gantry frame 420. The second gantry frame moving module 332 may be installed on the first horizontal support part 311 of the first support 310, and the fourth gantry frame moving module 342 may be installed on the second horizontal support part 321 of the second support 320. The second gantry frame moving module 332 and the fourth gantry frame moving module 342 may be disposed at both ends of the second gantry frame 420 to move the second gantry frame 420 in the second direction D2.

The gantry frame moving modules 331, 332, 341, and 342 may allow the first gantry frame 410 and the second gantry frame 420 to move on the first horizontal support part 311 and/or the second horizontal support part 321 in the second direction D2. Accordingly, by moving the first gantry frame 410 and the second gantry frame 420 in the second direction D2, it is possible to move the plurality of transfer head units HD1, HD2, HD3, and HD4 mounted on the first gantry frame 410 and the second gantry frame 420 in the second direction D2.

The plurality of transfer head units HD1, HD2, HD3, and HD4 may be moved in the second direction D2 by a transfer head unit moving module. The transfer head unit moving module may include a plurality of transfer head unit moving modules. The transfer head unit moving module may include a number of transfer head unit moving modules equal to the number of transfer head units. In an example embodiment, the transfer head unit moving module may include a first transfer head unit moving module 431, a second transfer head unit moving module 432, a third transfer head unit moving module 441, and a fourth transfer head unit moving module 442. The plurality of transfer head unit moving modules 431, 432, 441, and 442 may be installed on the first gantry frame 410 and the second gantry frame 420.

In detail, as depicted in FIG. 1, the first transfer head unit moving module 431 and the second transfer head unit moving module 432 may be installed on the first gantry frame 410. The first transfer head unit moving module 431 may allow the first transfer head unit HD1 to move on the first gantry frame 410 in the first direction D1. The second transfer head unit moving module 432 may allow the second transfer head unit HD2 to move on the first gantry frame 410 in the first direction D1.

The third transfer head unit moving module 441 and the fourth transfer head unit moving module 442 may be installed on the second gantry frame 420. The third transfer head unit moving module 441 may allow the third transfer head unit HD3 to move on the second gantry frame 420 in the first direction D1. The fourth transfer head unit moving module 442 may allow the fourth transfer head unit HD4 to move on the second gantry frame 420 in the first direction D1.

The plurality of transfer head units HD1, HD2, HD3, and HD4 may be horizontally or vertically moved by the gantry frame moving modules 331, 332, 341, and 342 and the transfer head unit moving modules 431, 432, 441, and 442 in the first direction D1 or in the second direction D2. Through the horizontal movement of the plurality of transfer head units HD1, HD2, HD3, and HD4, it is possible to perform a micro device transfer process by transferring a plurality of micro devices 520 (see FIG. 4) to the entire region of the target substrate SUB by means of the plurality of transfer head units HD1, HD2, HD3, and HD4 which have a smaller area than the target substrate SUB.

As depicted in FIG. 3, a vertical moving module may be further installed between each transfer head unit moving module 431, 432, 441, and 442 and a corresponding transfer head unit HD1, HD2, HD3, and HD4. The vertical moving module may include a first vertical moving part 451, a second vertical moving part 452, a third vertical moving part 461, and a fourth vertical moving part 462. The first vertical moving part 451 may be installed between the first transfer head unit HD1 and the first transfer head unit moving module 431. The second vertical moving part 452 may be installed between the second transfer head unit HD2 and the second transfer head unit moving module 432. The third vertical moving part 461 may be installed between the third transfer head unit HD3 and the third transfer head unit moving module 441. The fourth vertical moving part 462 may be installed between the fourth transfer head unit HD4 and the fourth transfer head unit moving module 442. The vertical moving parts 451, 452, 461, and 462 may adjust the distance between the stage 120 and each transfer head unit HD1, HD2, HD3, and HD4 by lifting the transfer head units HD1, HD2, HD3, and HD4 in the vertical direction with respect to the transfer head unit moving modules 431, 432, 441, and 442. That is, when the target substrate SUB is disposed on the stage 120, a process of seating a plurality of micro devices on the target substrate SUB may be performed by allowing the transfer head units HD1, HD2, HD3, and HD4 to be disposed to be adjacent to the target substrate SUB in the third direction D3 by the vertical moving parts 451, 452, 461, and 462.

The micro device transfer apparatus 1000 may further include a carrier substrate magazine WM. This will be described in detail with reference to FIGS. 4 and 5.

Figure 4:
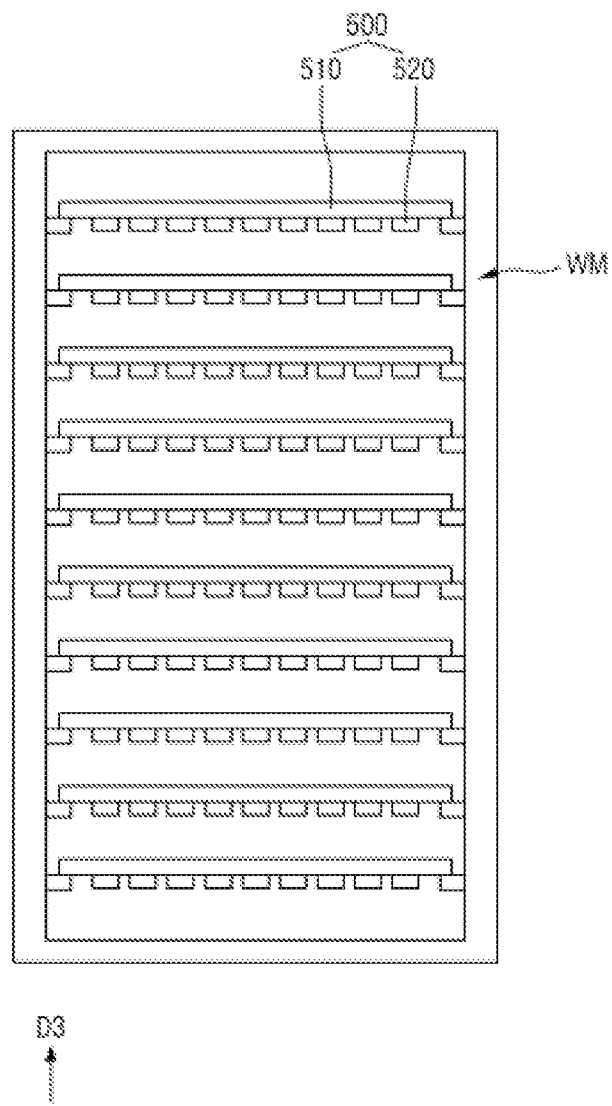
FIG. 4 is a schematic front view of a carrier substrate magazine of FIG. 1.

FIG. 4 is a schematic front view of a carrier substrate magazine of FIG. 1. FIG. 5 is a bottom view of a micro device/carrier substrate laminate of FIG. 4.

Referring to FIGS. 1, 2, 3, 4, and 5, the carrier substrate magazine WM may include a plurality of carrier substrate magazines WM1, WM2, WM3, and WM4. The micro device/carrier substrate laminate 500 may include a carrier substrate 510 and a plurality of micro devices 520 disposed on the carrier substrate 510. The carrier substrate magazine may serve to store a micro device/carrier substrate laminate 500 including a plurality of micro devices 520 to be transferred to the target substrate SUB and supply the micro device/carrier substrate laminate 500 to the transfer head units HD1, HD2, HD3, and HD4 through a carrier substrate supply part (not shown).

Each carrier substrate magazine WM may be externally disposed to be adjacent to at least one side of the stage unit 100. In an example embodiment, the carrier substrate magazine WM may be externally disposed to be adjacent to both long sides of the stage unit 100. A number of carrier substrate magazines equal to the number of transfer head units HD may be disposed. In the drawings, four transfer head units HD1, HD2, HD3, and HD4 and four carrier substrate magazines WM1, WM2, WM3, and WM4 are illustrated as being disposed as an example. However, various numbers of carrier substrate magazines may be disposed at various locations.

Each carrier substrate magazine WM may store a plurality of micro device/carrier substrate laminates 500. Referring to FIG. 4, the plurality of micro device/carrier substrate laminates 500 may be stacked on each carrier wafer magazine WM in the third direction D3. Although not shown, the micro device/carrier substrate laminates 500 disposed on the carrier substrate magazine WM may be supplied to the transfer head units HD1, HD2, HD3, and HD4 by means of a robot, a conveyor, or the like. When a micro device/carrier substrate laminate 500 disposed on the uppermost portion of the carrier substrate magazine WM is provided from the carrier substrate magazine WM to each transfer head unit HD, the next micro device/carrier substrate laminate 500 may be moved to the uppermost portion by a driving part of the carrier substrate magazine WM.

The carrier substrate 510 where the plurality of micro devices 520 are disposed may contain a material that is transparent to ultraviolet (UV) light. However, the plurality of micro devices 520 may be attached to a light-transmissive substrate by an adhesive agent.

The carrier substrate 510 may be a UV film. The UV film may include a UV transparent base film and a pressure-sensitive adhesive layer formed on one surface of the base film to fasten the substrate, and the pressure-sensitive adhesive layer may be a film having adhesive strength decreased when the film is exposed to ultraviolet light. Accordingly, when the carrier substrate 510 includes a UV film and is exposed to UV light, the adhesive strength of regions of the carrier substrate 510 exposed to UV light may be weakened. Alternatively, the plurality of micro devices 520 may be attached to the carrier substrate 510 capable of transmitting ultraviolet light by an adhesive agent having adhesive strength weakened when the carrier substrate 510 is exposed to UV light. The plurality of micro devices 520 formed on a wafer may be formed on or attached to the carrier substrate 510 through lamination or coating to form the micro device/carrier substrate laminate 500.

The plurality of micro devices 520 may be disposed on one surface of the carrier substrate 510 (i.e., a surface facing one side in the third direction D3). Each micro device 520 may include a light emitting diode (LED), an LED chip, a micro LED, and the like.

Referring to FIG. 5, the plurality of micro devices 520 may be arranged on the carrier substrate 510 in the form of a matrix. The plurality of micro devices 520 may be coplanar with and spaced a predetermined distance from each other in the first direction D1 and the second direction D2. The predetermined distance between two adjacent micro devices 520 will be described in detail below.

In the drawing, as an example, the planar shape of the carrier substrate 510 is a square, and the arrangement direction of the plurality of micro devices 520 is identical to the extending direction of each side of the carrier substrate 510. However, the planar shape of the carrier substrate 510 may be a circle.

The configuration of the transfer head unit HD according to an embodiment will be described in detail below.

Figure 6:
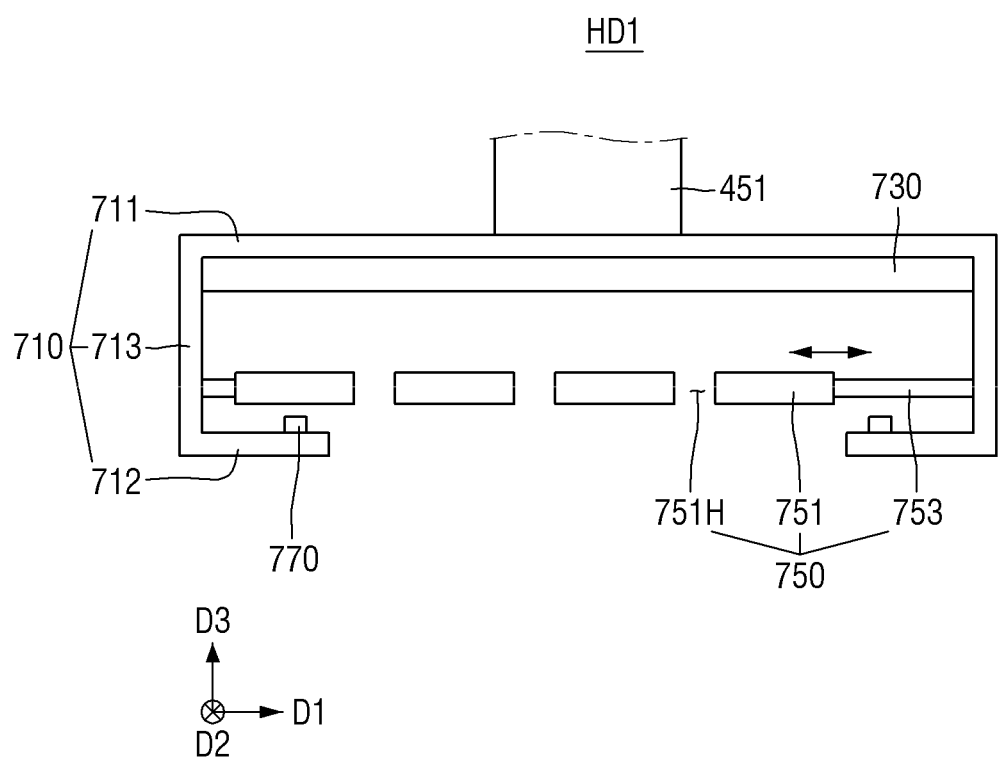
FIG. 6 is a sectional view of a transfer head unit according to an embodiment.

FIG. 6 is a sectional view of the transfer head unit according to an embodiment. The structure of a first transfer head unit HD1 according to an embodiment will be described in detail below.

Referring to FIG. 6, the first transfer head unit HD1 may include a light emitting part 730, a mask unit 750, a carrier substrate fastening part 770, and a housing 710 for accommodating the components.

The housing 710 may include a first horizontal surface 711, a side surface 713, and a second horizontal surface 712.

The side surfaces 713 may extend in the third direction D3 from both ends of the first horizontal surface 711, and the second horizontal surfaces 712 may extend in the horizontal direction (i.e., the first direction D1 or the second direction D2) from ends of both side surfaces 713. In an example embodiment, the second horizontal surface 712 may have a central region exposed in the third direction D3 when viewed from the top. By the carrier substrate 510 being disposed in the central region of the second horizontal surface 712, the plurality of micro devices 520 disposed on the carrier substrate 510 may be exposed in the third direction D3.

The light emitting part 730 may be disposed at an upper portion of the transfer head unit HD. The light emitting part 730 may serve to emit active light so that the active light may separate the plurality of micro devices 520 disposed on the carrier substrate 510 from the carrier substrate 510 of the micro device/carrier substrate laminate 500.

The active light emitted by the light emitting part 730 may be high-energy-level light. In an example embodiment, the active light may be near-ultraviolet light, ultraviolet light, or the like. In an example embodiment, when the carrier substrate 510 includes a UV film, the active light emitted by the light emitting part 730 may be UV light. The active light emitted by the light emitting part 730 may mostly travel downwardly.

The light emitting part 730 may be disposed on a bottom side of the first horizontal surface 711 forming the upper portion of the transfer head unit HD. In the drawing, the light emitting part 730 is illustrated as being disposed on the whole bottom side of the first horizontal surface 711. However, the light emitting part 730 may be disposed on only a portion of the bottom side of the first horizontal surface 711 or may be spaced a predetermined distance from the bottom side of the first horizontal surface 711.

The mask unit 750 may be disposed below the light emitting part 730. The mask unit 750 and the light emitting part 730 may be entirely disposed apart from each other in the third direction D3. The mask unit 750 may include a mask 751 including a plurality of opening parts 751H and the other region, i.e., a shielding part, and a mask moving module 753 for moving the mask 751 in the horizontal direction.

The mask 751 may contain a light shielding material, i.e., a material that does not transmit UV light emitted by the light emitting part 730. Accordingly, when the active light emitted by the light emitting part 730 travels to the shielding part of the mask 751, the shielding part may cause the active light not to reach at least a partial region of the carrier substrate 510 of the micro device/carrier substrate laminate 500. That is, by including a plurality of patterned opening parts 751H, the mask 751 serves to selectively separate only some of the plurality of micro devices 520 disposed on the carrier substrate 510 onto the target substrate SUB.

The plurality of opening parts 751H are disposed on the mask 751 to pass through the mask 751. The planar shape of each opening part 751H is not limited. For example, the planar shape of the opening part 751H may be a circle or a square. The shape and displacement of the plurality of opening parts 751H will be described in detail below with reference to FIG. 11.

The mask moving module 753 may be disposed on a side surface of the mask 751. The mask moving module 753 may disposed on the side surface of the mask 751 to move the mask 751 in the horizontal direction. Accordingly, as will be described below, the mask moving module 753 may serve to adjust the locations of the micro devices 520 to be separated from the carrier substrate 510 relative to the opening parts 751H during each separation step.

The carrier substrate fastening part 770 may be disposed at a lower portion of the transfer head unit HD. The carrier substrate fastening part 770 may be disposed on a top side of the second horizontal surface 712. The carrier substrate fastening part 770 may fasten, in the transfer head unit HD, one carrier substrate 510 in which a plurality of micro devices 520 received from a carrier substrate magazine WM are disposed. By fastening the carrier substrate 510 to the transfer head unit HD, the carrier substrate fastening part 770 may align a relative location between the carrier substrate 510 and the mask 751 just through the movement of the mask 751.

In an example embodiment, the transfer head units HD may have the same structure. Accordingly, the structure of the first transfer head unit HD1 may be applied to those of the second transfer head unit HD2, the third transfer head unit HD3, and the fourth transfer head unit HD4. Accordingly, the same description of the structures of the second transfer head unit HD2, the third transfer head unit HD3, and the fourth transfer head unit HD4 will be omitted.

A method of transferring the micro devices 520 using the micro device transfer apparatus 1000 according to the above embodiment will be described below.

Figure 7:
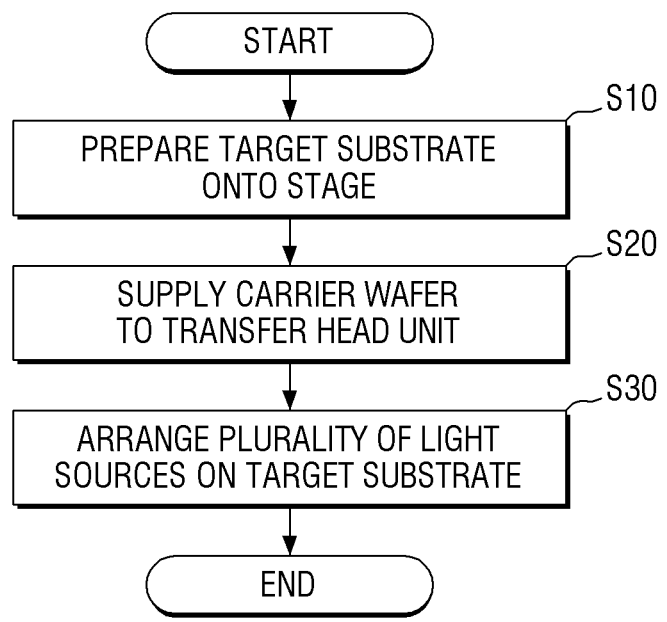
FIG. 7 is a flowchart showing a micro device transfer method according to an embodiment.
Figure 9:
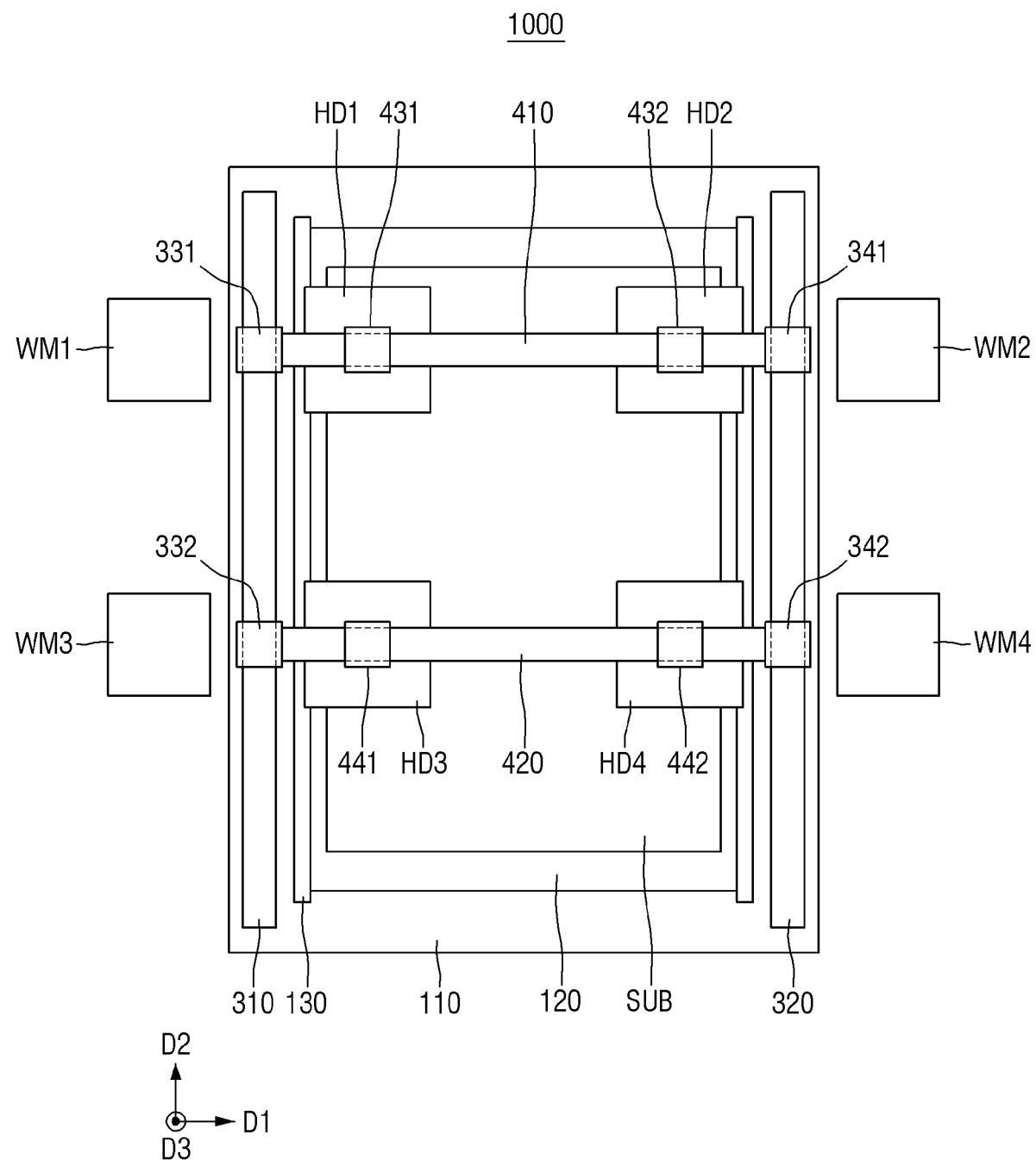
FIG. 9 is a top plan view showing a micro device transfer apparatus and a target substrate.

FIG. 7 is a flowchart showing a micro device transfer method according to an embodiment. FIG. 9 is a top plan view showing a micro device transfer apparatus and a target substrate.

Referring to FIG. 7, the micro device transfer method according to an embodiment may include a step of preparing a target substrate SUB on a stage 120 of a micro device transfer apparatus 1000 (S10), a step of supplying a carrier wafer to a transfer head unit HD (S20), and a step of arranging a plurality of light sources on the target substrate (S30).

Referring to FIGS. 1, 2, 3, 7, and 9, a target substrate SUB is prepared on the stage 120 of the micro device transfer apparatus 1000 (S10).

As shown in FIG. 9, the target substrate SUB may be disposed on the stage 120 such that a surface opposite to a first surface of the target substrate SUB to which a plurality of micro devices 520 are attached is supported by the stage 120.

As described above, the micro device transfer apparatus 1000 includes the stage 120, a plurality of transfer head units HD1, HD2, HD3, and HD4, and a plurality of carrier substrate magazines WM1, WM2, WM3, and WM4. A plurality of micro device/carrier substrate laminates 500 are disposed in the carrier substrate magazines WM1, WM2, WM3, and WM4. For example, the first transfer head unit HD1 may be located to be adjacent to the first carrier substrate magazine WM1, the second transfer head unit HD2 may be located to be adjacent to the second carrier substrate magazine WM2, the third transfer head unit HD3 may be located to be adjacent to the third carrier substrate magazine WM3, and the fourth transfer head unit HD4 may be located to be adjacent to the fourth carrier substrate magazine WM4.

The target substrate SUB may be disposed at the center of the stage 120 of the micro device transfer apparatus 1000. The target substrate SUB may have a planar shape of a rectangle including long and short sides. The short side of the target substrate SUB may be disposed parallel to the short side of the stage 120, and the long side of the target substrate SUB may be disposed parallel to the long side of the stage 120. In an example embodiment, the target substrate SUB may be a large-scale substrate having a rectangular shape including a long side having a length of about 2000 mm to 2500 mm and a short side having a length of about 1800 mm to 2200 mm.

Particularly, the transfer head units HD may be located on the stage unit 100 adjacent to the carrier substrate magazines WM1, WM2, WM3, and WM4. Accordingly, each transfer head unit HD may not at least partially overlap with the target substrate SUB in the third direction D3 when viewed from the top. Each transfer head unit HD may be located side by side each other at least.

Subsequently, one micro device/carrier substrate laminate 500 including a plurality of micro devices 520 is supplied to each transfer head unit HD (S20).

In detail, a micro device/carrier substrate laminate 500 disposed in the carrier substrate magazine WM is provided to the transfer head unit HD using a robot, a conveyer belt, or the like. The first transfer head unit HD1 may receive one micro device/carrier substrate laminate 500 from the first carrier substrate magazine WM1 adjacent to the first transfer head unit HD1, the second transfer head unit HD2 may receive one micro device/carrier substrate laminate 500 from the second carrier substrate magazine WM2 adjacent to the second transfer head unit HD2, the third transfer head unit HD3 may receive one micro device/carrier substrate laminate 500 from the third carrier substrate magazine WM3 adjacent to the third transfer head unit HD3, and the fourth transfer head unit HD4 may receive one micro device/carrier substrate laminate 500 from the fourth carrier substrate magazine WM4 adjacent to the fourth transfer head unit HD4. A micro device/carrier substrate laminate 500 disposed on an uppermost layer among a plurality of micro device/carrier substrate laminates 500 disposed in each carrier substrate magazine WM may be provided to a corresponding transfer head unit HD.

Each transfer head unit that has received the micro device/carrier substrate laminate 500 may fasten the carrier substrate 510 to the carrier substrate fastening part 770. The micro device/carrier substrate laminate 500 fastened to the carrier substrate fastening part 770 may be disposed such that the micro device 520 is oriented downwardly and an upper surface of the carrier substrate 510 faces a lower surface of the shielding part of the mask 751.

Subsequently, at least some of the plurality of micro devices 520 are separated from the carrier substrate 510 and transferred from the micro device/carrier substrate laminate 500 on each transfer head unit HD to the target substrate SUB (S30).

The step of S30 will be described in detail in conjunction with FIGS. 8, and 10, 11, 12, 13, 14, 15, 16, 17, 18 and 19.

Figure 8:
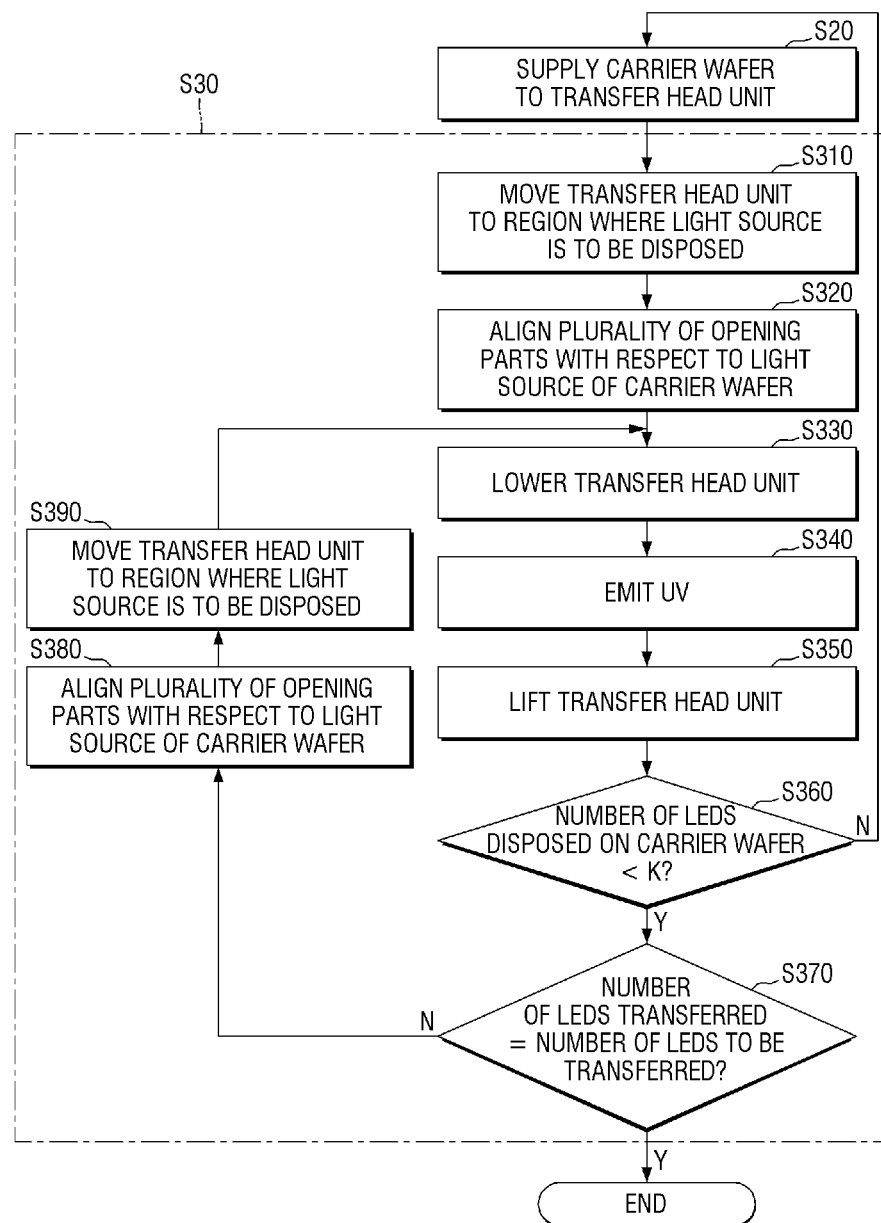
FIG. 8 is a flowchart showing example detailed processes of a step S20 and a step S30 of FIG. 7.
Figure 10:
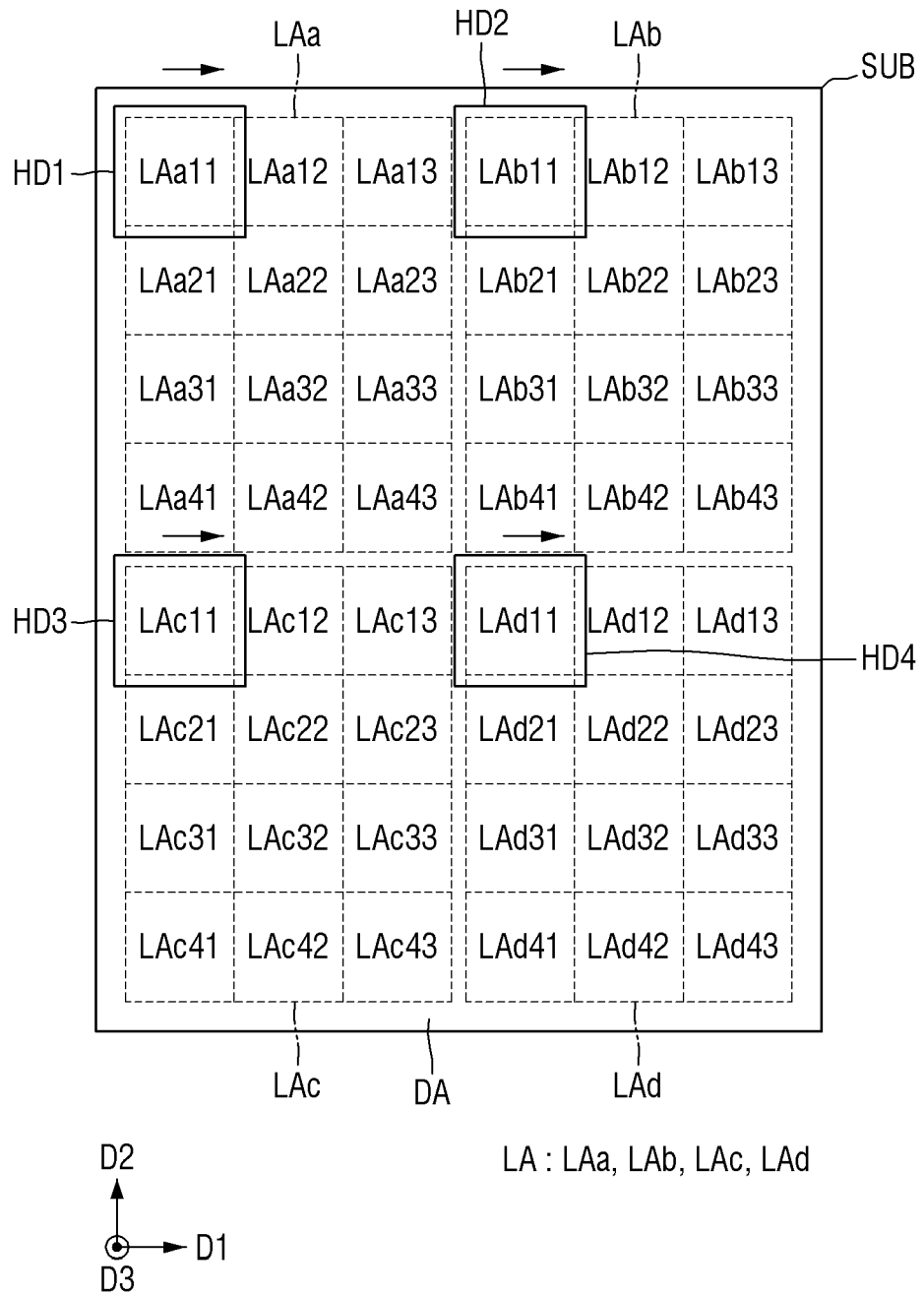
FIG. 10 is a layout diagram showing an example of relative placement of a plurality of transfer head units and a target substrate in S310 of FIG. 8.
Figure 11:
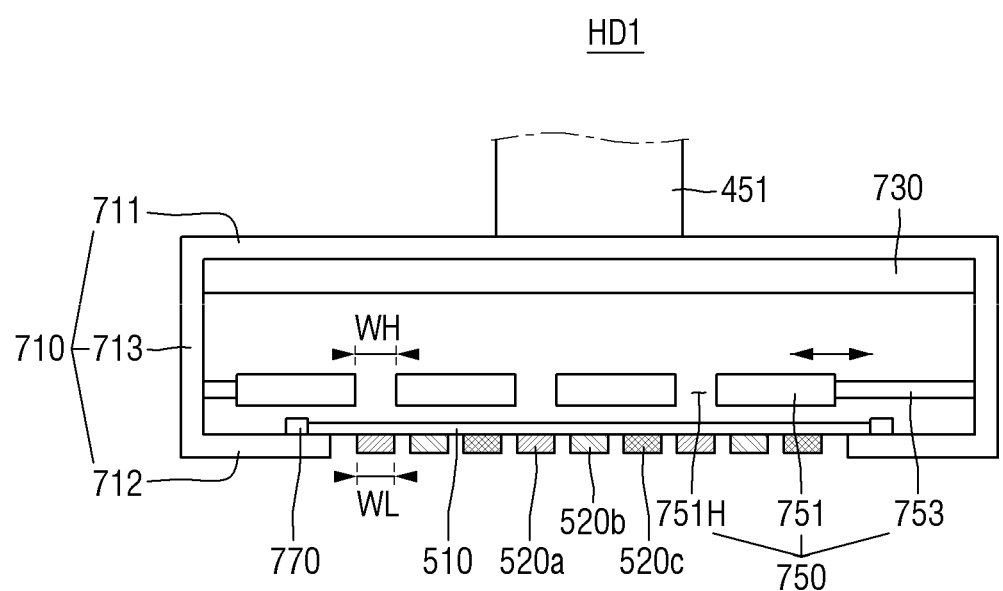
FIG. 11 is a sectional view showing examples of a transfer head unit and a micro device/carrier substrate laminate in step of S320 of FIG. 8.
Figure 13:
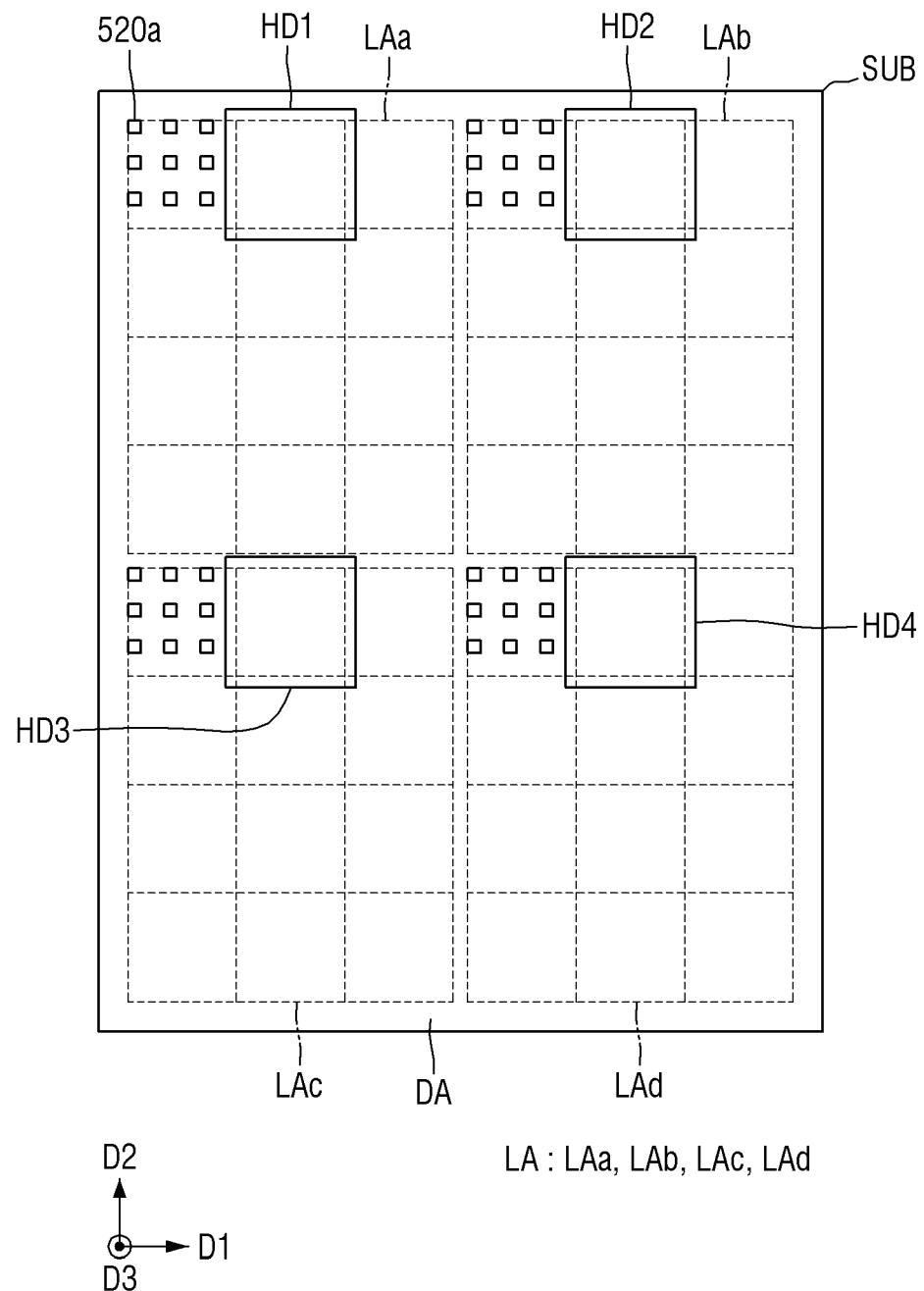
FIG. 13 is a layout diagram showing an example of relative placement of a plurality of transfer head units and a target substrate in step of S380 of FIG. 8.

FIG. 8 is a flowchart showing examples of S20 and S30 of FIG. 7 in detail. FIG. 10 is a layout diagram showing an example of relative placement of a plurality of transfer head units and a target substrate in S310 of FIG. 8. FIG. 11 is a sectional view showing examples of a transfer head unit and a micro device/carrier substrate laminate in S320 of FIG. 8. FIG. 12 is a layout diagram showing relative placement of a mask and a micro device/carrier substrate laminate of FIG. 11. FIG. 13 is a layout diagram showing an example of relative placement of a plurality of transfer head units and a target substrate in S380 of FIG. 8. FIGS. 14, 15, 16, 17, 18, and 19 are schematic diagrams showing a micro device transfer method.

Referring to FIGS. 8, 9, and 10, each transfer head unit HD moves to a first transfer target region where the micro device 520 is to be disposed (S310 in FIG. 8).

In detail, by driving the gantry frame moving modules 331, 332, 341, and 342, and the transfer head unit moving modules 431, 432, 441, and 442, the micro device transfer apparatus 1000 may horizontally move the transfer head units HD to a transfer target location such that the transfer head units HD are disposed in the thickness direction with respect to the transfer target location to be overlapped.

Referring to FIG. 10, the target substrate SUB may include a transfer region LA to which the micro devices 520 are to be transferred and a non-transfer region DA. The transfer region LA of the target substrate SUB may be divided into a number of regions equal to the number of transfer head units HD. As described above, the micro device transfer apparatus 1000 may include four transfer head units HD1, HD2, HD3, and HD4, and the target substrate SUB may include four transfer regions where the transfer head units HD1, HD2, HD3, and HD4 perform transfer. The first transfer head unit HD1 may transfer a plurality of micro devices 520 to a transfer region "a" LAa, the second transfer head unit HD2 may transfer a plurality of micro devices 520 to a transfer region "b" LAb, the third transfer head unit HD3 may transfer a plurality of micro devices 520 to a transfer region "c" LAc, and the fourth transfer head unit HD4 may transfer a plurality of micro devices 520 to a transfer region "d" LAd. The transfer regions may have the same area, but the present disclosure is not limited.

The transfer regions of the target substrate SUB where the transfer process of the transfer head units HD1, HD2, HD3, and HD4 is performed may be divided in a matrix array depending on the areas of the transfer head units HD1, HD2, HD3, and HD4. Each of the transfer head units HD1, HD2, HD3, and HD4 may be moved to a first transfer target region where a first separation operation is to be performed. The first transfer target region may include a plurality of first transfer target regions where the first separation operation is to be performed by the transfer head units HD1, HD2, HD3, and HD4. The first transfer target region may include a region "a11" LAa11, a region "b11" LAb11, a region "c11" LAc11, and a region "d11" LAd11.

For example, the first transfer head unit HD1 may move to the region "a11" LAa11 of the target substrate SUB, the second transfer head unit HD2 may move to the region "b11" LAb11 of the target substrate SUB, the third transfer head unit HD3 may move to the region "c11" LAc11 of the target substrate SUB, and the fourth transfer head unit HD4 may move to the region "d11" LAd11 of the target substrate SUB.

Hereinafter, the driving of each transfer head unit performing transfer to the first transfer target region of the target substrate SUB may be replaced with the driving of the first transfer head unit HD1. The driving of the second transfer head unit HD2, the third transfer head unit HD3, and the fourth transfer head unit HD4 may be the same as described below.

Next, the locations of micro devices 520 separated from the carrier substrate 510 to the first transfer target region of the target substrate SUB are aligned relative to the plurality of opening parts 751H of the mask 751 (S320 in FIG. 8).

In detail, by changing relative locations with respect to the carrier substrate 510 fastened to the carrier substrate fastening part 770, the mask moving module 753 may perform alignment such that the opening parts 751H of the mask are overlapped with the micro devices 520a disposed in the first transfer target region in the third direction D3.

Referring to FIGS. 11 and 12, first micro devices 520a disposed in the region "a11" LAa11 of the first transfer target region among the plurality of micro devices 520 disposed on the carrier substrate 510 may be arranged in a matrix array at predetermined distances. The distance between the first micro devices 520a disposed in the region "a11" LAa11 of the first transfer target region may be the same as the pitch distance between the micro devices disposed on the target substrate SUB.

The opening parts 751H may be disposed in the mask 751 to expose the micro devices 520 in the third direction D3. Accordingly, the width WH of the opening parts 751H may be greater than the width WL of the micro devices 520. However, when the plurality of micro devices 520 are to be disposed on the target substrate SUB on a group basis, the opening parts 751H may be formed to have a different width so as to expose all of the plurality of micro devices 520.

Next, each transfer head unit HD located above the target substrate SUB is lowered onto the target substrate SUB (S330 in FIG. 8).

In detail, by driving the vertical moving module, each transfer head unit HD may be vertically moved to be adjacent to the first transfer target region of the target substrate SUB. The first transfer head unit HD1 may be lowered to be adjacent to the region "a11" LAa11 of the target substrate SUB by driving the first vertical moving part 451, the second transfer head unit HD2 may be lowered to be adjacent to the region "b11" LAb11 of the target substrate SUB by driving the second vertical moving part 452, the third transfer head unit HD3 may be lowered to be adjacent to the region "c11" LAc11 of the target substrate SUB by driving the third vertical moving part 461, and the fourth transfer head unit HD4 may be lowered to be adjacent to the region "d11" LAd11 of the target substrate SUB by driving the fourth vertical moving part 462.

Figure 14:
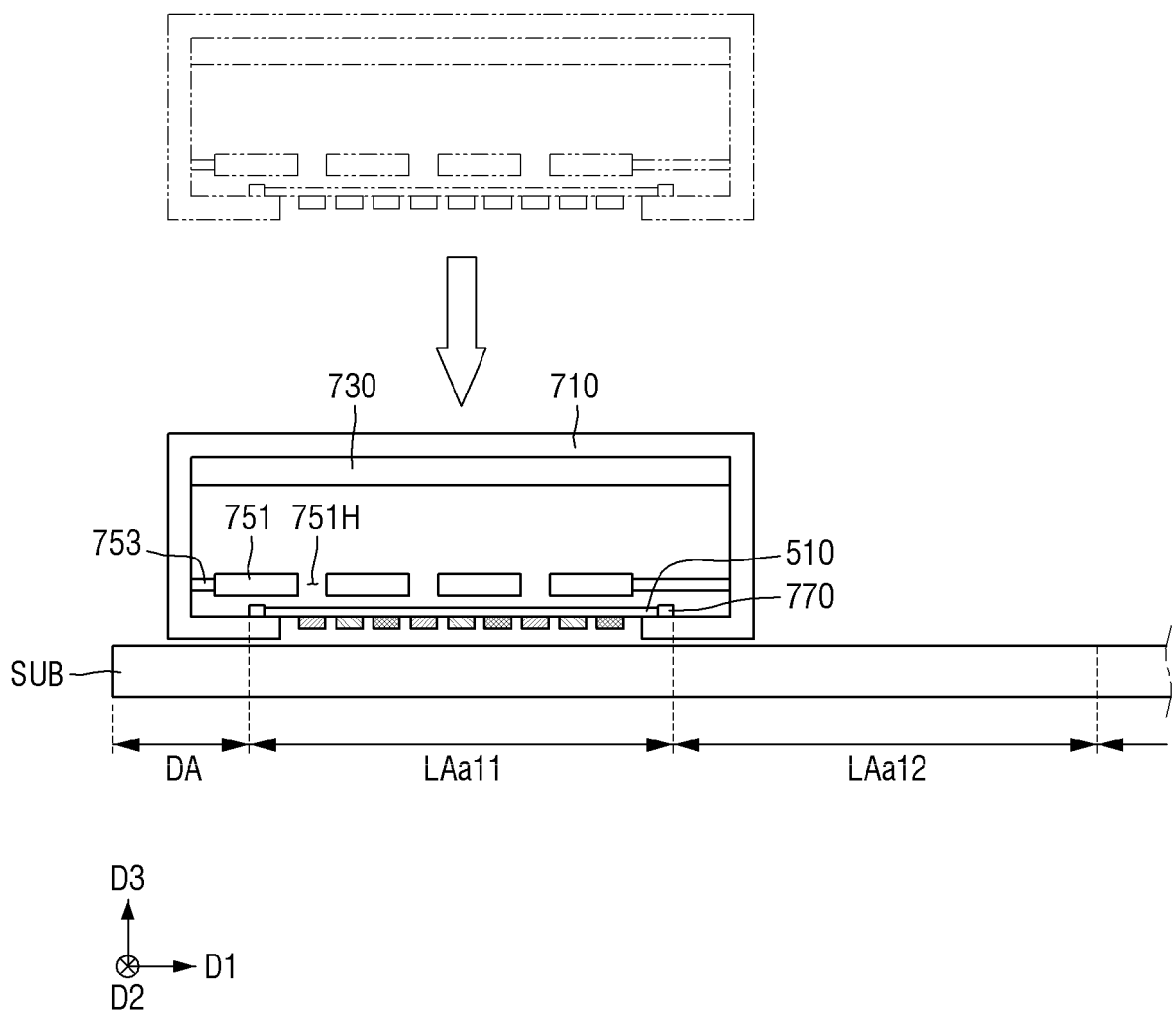

Referring to FIG. 14, the first transfer head unit HD1 located on the region "a11" LAa11 of the target substrate SUB may be spaced a predetermined distance from the target substrate SUB in the third direction D3, but may be disposed to be adjacent to the target substrate SUB. By the first transfer head unit HD1 being disposed to be adjacent to the target substrate SUB, it is possible to prevent transfer to a location different from a transfer target location while the micro devices 520 are being separated from the carrier substrate 510 in a subsequent operation.

Next, active light is emitted by the light emitting part 730 (S340 in FIG. 8).

Figure 15:
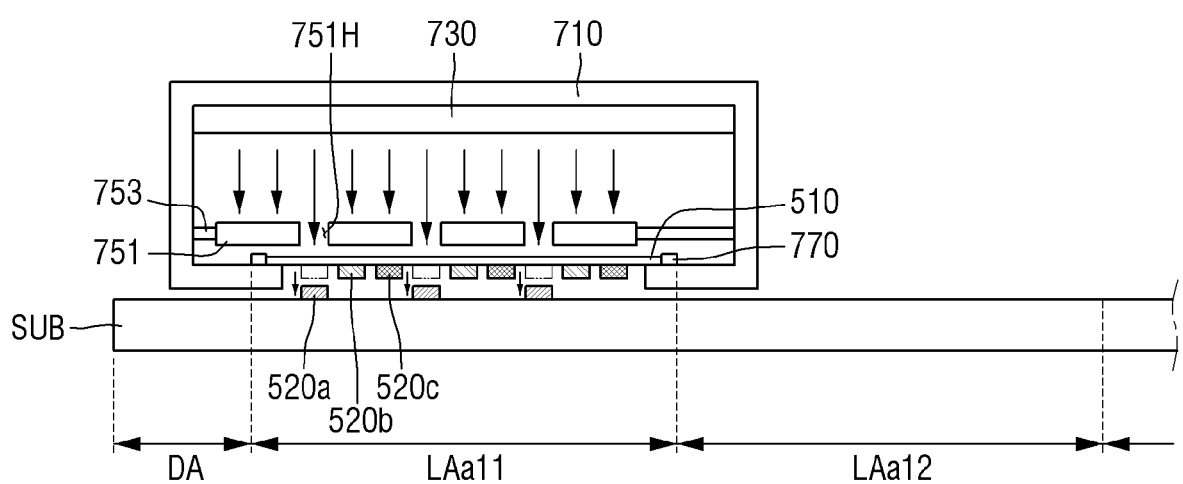

In detail, referring to FIG. 15, active light may be emitted onto the mask 751 including the opening parts 751H and the shielding part by the light emitting part 730. Some first micro devices 520a transferred onto the region "a11" LAa11 may be exposed to the active light emitted from the light emitting part 730 by the opening parts 751H of the mask 751, and the other micro devices 520b and 520c may be shielded by the shielding part of the mask 751. Accordingly, the carrier substrate 510 located above some first micro devices 520a transferred to the region "a11" LAa11 may be exposed to the active light by the opening parts 751H of the mask 751 to have weakened adhesion. Accordingly, some first micro devices 520a disposed on the carrier substrate 510 may be separated from the carrier substrate 510 and attached to the region "a11" LAa11 of the target substrate SUB.

Although not shown, a flexible film or a soldering portion is disposed in the regions of the target substrate SUB to which the micro devices 520 are to be attached in order to fasten the micro devices 520 to the target substrate SUB.

Next, each transfer head unit HD is lifted up to a predetermined distance from the target substrate SUB (S350 in FIG. 8).

In detail, by driving the vertical moving module, each transfer head unit HD may be vertically moved from the first transfer target region of the target substrate SUB. The first transfer head unit HD1 may be lifted from the region "a11" LAa11 of the target substrate SUB by driving the first vertical moving part 451, the second transfer head unit HD2 may be lifted from the region "b11" LAb11 of the target substrate SUB by driving the second vertical moving part 452, the third transfer head unit HD3 may be lifted from the region "c11" LAc11 of the target substrate SUB by driving the third vertical moving part 461, and the fourth transfer head unit HD4 may be lifted from the region "d11" LAd11 of the target substrate SUB by driving the fourth vertical moving part 462.

Figure 16:
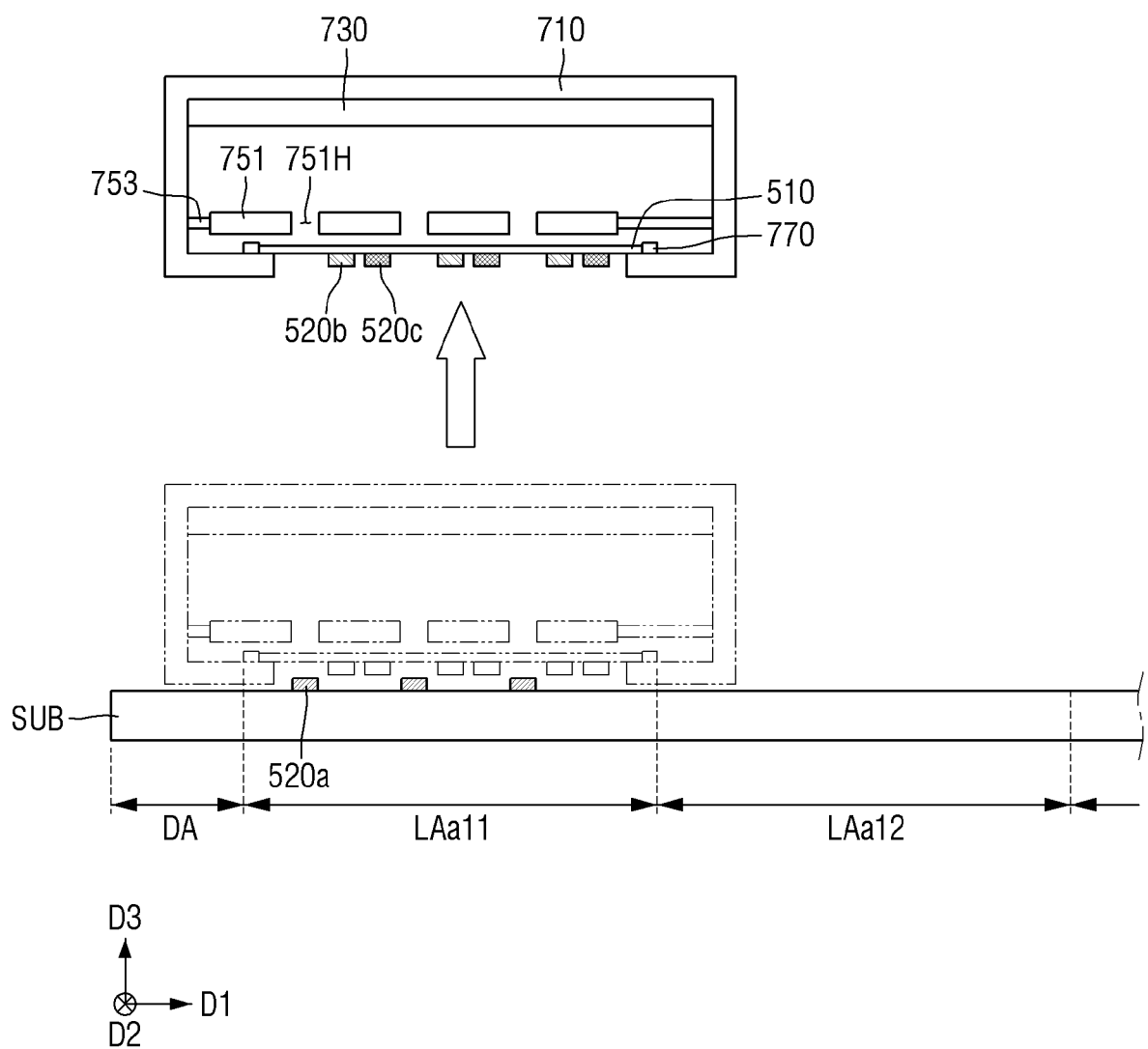

Referring to FIG. 16, the first transfer head unit HD1 located on the region "a11" LAa11 of the target substrate SUB may be vertically lifted from the target substrate SUB in the third direction D3. The first transfer head unit HD1 may be separated from the base frame 110 by lifting up where the first head unit HD1 has been located in an initial step, but the present disclosure is not limited.

Next, each transfer head unit HD is moved to a subsequent transfer target region (S380 in FIG. 8).

In detail, the micro device transfer apparatus 1000 may move the transfer head units HD to the subsequent transfer target region by driving the gantry frame moving modules 331, 332, 341, and 342 and the transfer head unit moving modules 431, 432, 441, and 442. The subsequent transfer target region may be a second transfer target region. By driving the gantry frame moving modules 331, 332, 341, and 342 and the transfer head unit moving modules 431, 432, 441, and 442, the micro device transfer apparatus 1000 may horizontally move the transfer head units HD such that the transfer head units HD are disposed in the thickness direction with respect to the second transfer target region to be partially overlapped.

For example, referring to FIGS. 10, 11, 12, and 13, the second transfer target region may include a region "a12" LAa12, a region "b12" LAb12, a region "c12" LAc12, and a region "d12" LAd12. For example, the first transfer head unit HD1 may be horizontally moved in the first direction D1 from the region "a11" LAa11 to the region "a12" LAa12 of the target substrate SUB through the first transfer head unit moving module 431, the second transfer head unit HD2 may be horizontally moved in the first direction D1 from the region "b11" LAb11 to the region "b12" LAb12 of the target substrate SUB through the second transfer head unit moving module 432, the third transfer head unit HD3 may be horizontally moved in the first direction D1 from the region "c11" LAc11 to the region "c12" LAc12 of the target substrate SUB through the third transfer head unit moving module 441, and the fourth transfer head unit HD4 may be horizontally moved in the first direction D1 from the region "d11" LAd11 to the region "d12" LAd12 of the target substrate SUB through the fourth transfer head unit moving module 442.

Referring to FIGS. 13, 14, 15, and 16, the first transfer head unit HD1 may be disposed in the region "a12" LAa12 of the second transfer target region. In order to place the plurality of micro devices 520 on the target substrate SUB at regular intervals, the first transfer head unit HD1 may be disposed in the third direction D3 with respect to the region "a11" LAa11 in an overlapping meaner when viewed from the top. The present disclosure is not limited, and the planar area of the transfer head unit HD may be greater than the area of the plurality of unit transfer regions.

In an example embodiment, the second transfer target region and the first transfer target region are shown as being in the same row, but may be placed in the same column. In this case, by horizontally moving the first gantry frame 410 and/or the second gantry frame 420 in the second direction D2 through the gantry frame moving modules 331, 332, 341, and 342, each transfer head unit HD may be moved from the first transfer target region to the second transfer target region. By horizontally moving each transfer head unit in the same direction, it is possible to prevent collision between the transfer head units during the transfer process.

Next, the locations of second micro devices 520b separated from the carrier substrate 510 to the second transfer target location of the target substrate SUB are aligned relative to the plurality of opening parts 751H of the mask 751 (S390 in FIG. 8).

In detail, by changing relative locations with respect to the carrier substrate 510 fastened to the carrier substrate fastening part 770, the mask moving module 753 may perform alignment such that the opening parts 751H of the mask are overlapped with the second micro devices 520b disposed in the second transfer target region in the third direction D3.

Referring to FIG. 18, by driving the mask moving module 753, the mask 751 may be moved in the horizontal direction to perform alignment such that the second micro devices 520b and the opening parts 751H disposed in the mask 751 are placed in the third direction D3 to be overlapped. In the first separation step, the second micro devices 520b disposed in the region "a12" LAa12 of the second transfer target region among the plurality of micro devices 520b and 520c disposed in the carrier substrate 510 may be arranged in the form of a matrix at predetermined intervals, like the first micro devices 520a. The interval among the second micro devices 520b disposed in the region "a12" LAa12 of the second transfer target region may be the same as the separation distance among the micro devices disposed on the target substrate SUB.

By appropriately adjusting a ratio between a distance DP between two adjacent first micro devices 520a disposed on the target substrate SUB and a distance DL between two adjacent first micro devices 520a disposed on the carrier substrate 510, it is possible to efficiently transfer all of the plurality of first micro devices 520a disposed on the carrier substrate 510 onto the target substrate SUB.

Figure 19:
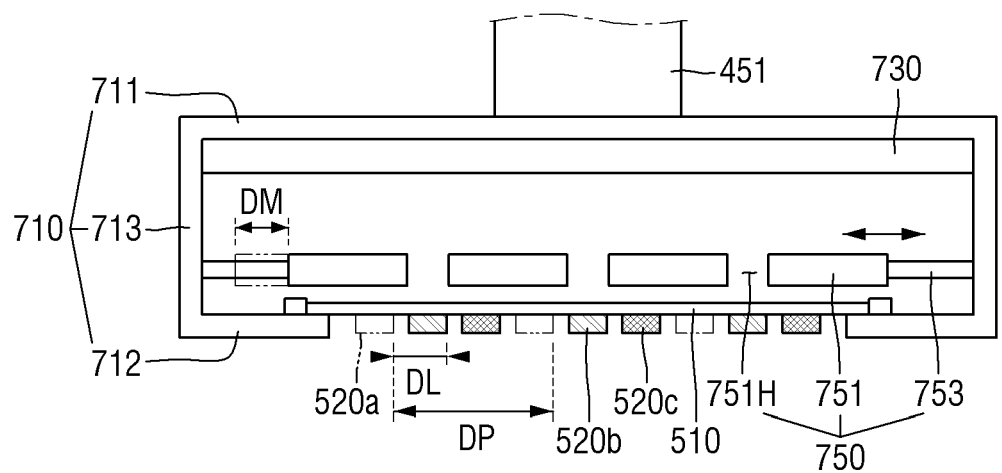

Referring to FIG. 19, the distance DP between the two adjacent first micro devices 520a disposed on the target substrate SUB may be defined as a distance from one side surface of a micro device 520a disposed in the same transfer target region of the target substrate SUB to one side surface of another micro device 520a adjacent to that of the micro device 520a. Likewise, the distance DL between the two adjacent first micro devices 520a disposed on the carrier substrate 510 may be defined as a distance from one side surface of a first micro device 520a disposed in the carrier substrate 510 to one side surface of another first micro device 520a adjacent to that of the first micro device 520a.

By adjusting the distance DL between the two adjacent first micro devices 520a disposed on the carrier substrate 510 to be 1/(natural number) times as great as the distance DP between the two adjacent first micro devices 520a disposed on the target substrate SUB, that is, by adjusting the distance DP between the two adjacent first micro devices 520a disposed on the target substrate SUB to be a natural number times as great as the distance DL between the two adjacent first micro devices 520a disposed on the carrier substrate 510, a plurality of separation steps may be performed on one micro device/carrier substrate laminate 500 using the same mask 751.

Meanwhile, the distance between the plurality of opening parts 751H disposed in the mask 751 may be proportional to the distance between the first micro devices 520a disposed on the target substrate SUB. Also, in a second separation step, a movement distance DM of the mask 751 being moved in the horizontal direction by the mask moving module 753 may be the same as the distance DL between the two adjacent first micro devices 520a disposed on the carrier substrate 510. In the second separation step, by adjusting the movement distance DM of the mask 751 being moved in the horizontal direction by the mask moving module 753 to be the same as the distance DL between the two adjacent first micro devices 520a disposed on the carrier substrate 510, it is possible to efficiently transfer all of the plurality of micro devices 520 disposed on the carrier substrate 510 onto the target substrate SUB.

Referring to FIG. 8 again, after each separation step after S350, the micro device transfer method may further include comparing the number of micro devices 520 remaining on the carrier substrate 510 and a predetermined number K of micro devices 520 disposed in each unit transfer region (S360 in FIG. 8).

In detail, when the number K of micro devices 520 remaining on the carrier substrate 510 is smaller than the predetermined number K of micro devices 520 disposed in each unit transfer region, the existing carrier substrate 510 that has been disposed on the transfer head unit HD may be returned, and each transfer head unit HD may receive a new micro device/carrier substrate laminate 500 from the carrier substrate magazine WM (N of S360 in FIG. 8).

Also, when the number of micro devices 520 remaining on the carrier substrate 510 is greater than or equal to the predetermined number of micro devices 520 disposed in each unit transfer region, the number of micro devices 520 transferred onto the target substrate SUB and the predetermined number of micro devices 520 to be transferred onto the target substrate SUB may be compared with each other (Y of S360 in FIG. 8).

When the number of micro devices 520 transferred onto the target substrate SUB is equal to the predetermined number of micro devices 520 to be transferred onto the target substrate SUB (Y of S370 in FIG. 8), the target substrate SUB may be moved from the stage 120 to the outside by the stage moving part 130. When the number of micro devices 520 transferred onto the target substrate SUB is not equal to the predetermined number of micro devices 520 to be transferred onto the target substrate SUB (N of S370 in FIG. 8), each transfer head unit HD may perform a subsequent separation operation. That is, each transfer head unit HD is moved to a subsequent transfer target location (S380 in FIG. 8).

Figure 20:
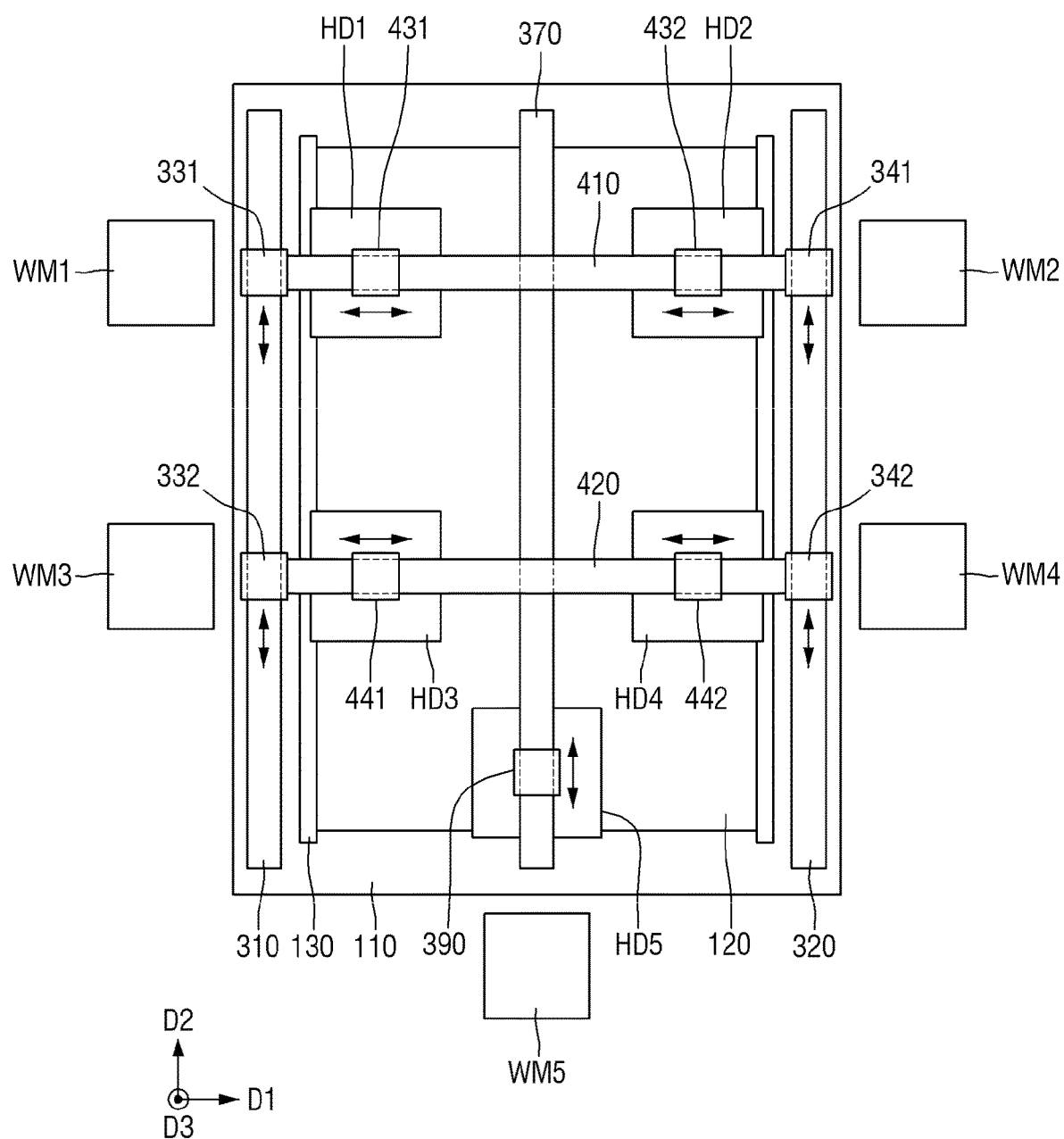
FIG. 20 is a top plan view of a micro device transfer apparatus according to another embodiment.
Figure 21:
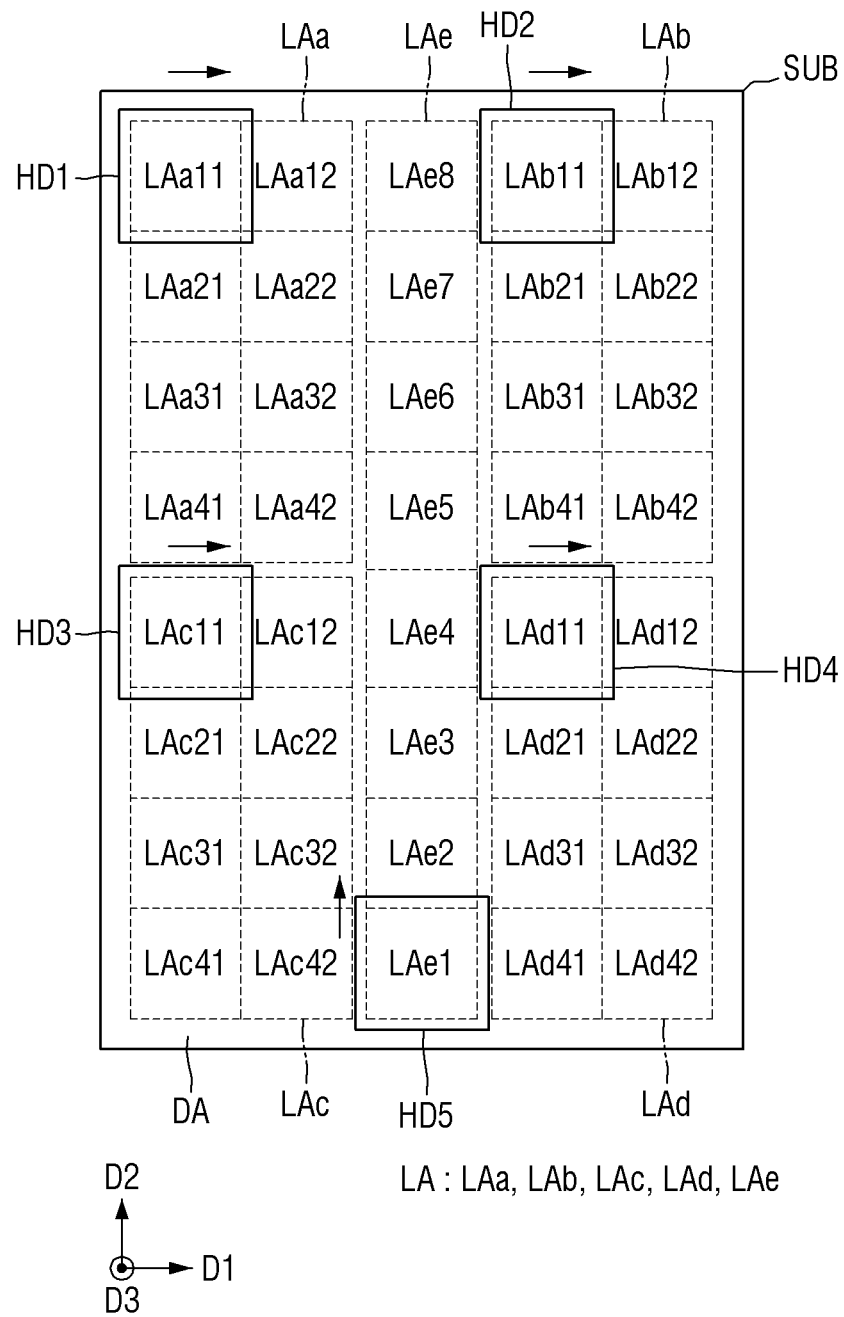
FIG. 21 is a layout diagram showing relative placement of a plurality of transfer head units and a target substrate of FIG. 20.

FIG. 20 is a top plan view of a micro device transfer apparatus according to another embodiment. FIG. 21 is a layout diagram showing relative placement of a plurality of transfer head units and a target substrate of FIG. 20.

The embodiment shown in FIGS. 20 and 21 is different from the embodiment shown in FIG. 9 in that a fifth transfer head unit HD is further included. The embodiment shown in FIGS. 20 and 21 will be described, focusing on differences from the embodiment shown in FIGS. 9 and 10.

Referring to FIGS. 20 and 21, a micro device transfer apparatus 1000_2 may further include a third support 370, a fifth transfer head unit HD5, a fifth carrier substrate magazine WM5, and a fifth transfer head unit moving module 390.

In detail, the third support 370 may be disposed on the base frame 110 of the stage unit 100. The third support 370 may be disposed between the first support 310 and the second support 320. The third support 370 may be spaced a predetermined distance apart from the first support 310 and the second support 320. The third support 370 may be disposed at the center of the stage unit 100.

The third support 370 may include a third horizontal support part extending in a horizontal direction and a third vertical support part connected to both ends of the third horizontal support part and extending in the third direction D3, which is a vertical direction. The extending direction of the third horizontal support part may be the same as the second direction D2, which is the long side direction of the stage unit 100. The third horizontal support part may be spaced a predetermined distance from the base frame 110 by the third vertical support part. The distance from the base frame 110 up to the third horizontal support part may be smaller than the distance from the base frame 110 up to the first horizontal support part 311. Accordingly, the third horizontal support part may be disposed below the first gantry frame 410 and the second gantry frame 420.

The fifth transfer head unit HD5 may be mounted on the third support 370. The fifth transfer head unit HD5 may be moved in the horizontal direction by the fifth transfer head unit moving module 390. The fifth transfer head unit HD5 may be moved in the extending direction of the third support 370, that is, in the second direction D2. Unlike movement paths of the first transfer head unit HD1, the second transfer head unit HD2, the third transfer head unit HD3, and the fourth transfer head unit HD4, the fifth transfer head unit HD5 may be moved only in the second direction D2 to transfer a plurality of micro devices 520 onto a transfer region "e" LAe of the target substrate SUB.

In this embodiment, the target substrate SUB may be divided into five regions equal to the number of transfer head units, that is, a transfer region "a" LAa, a transfer region "b" LAb, a transfer region "c" LAc, a transfer region "d" LAd, and a transfer region "e" LAe, and each transfer head unit HD may transfer the plurality of micro devices 520 onto a corresponding transfer region. The transfer regions may have different areas. The present disclosure has a technical meaning with respect to a uniform planar area ratio between the target substrate SUB and the carrier substrate 510 or a uniform region of the target substrate SUB where the micro devices 520 are disposed without collision between the transfer head units.

Figure 22:
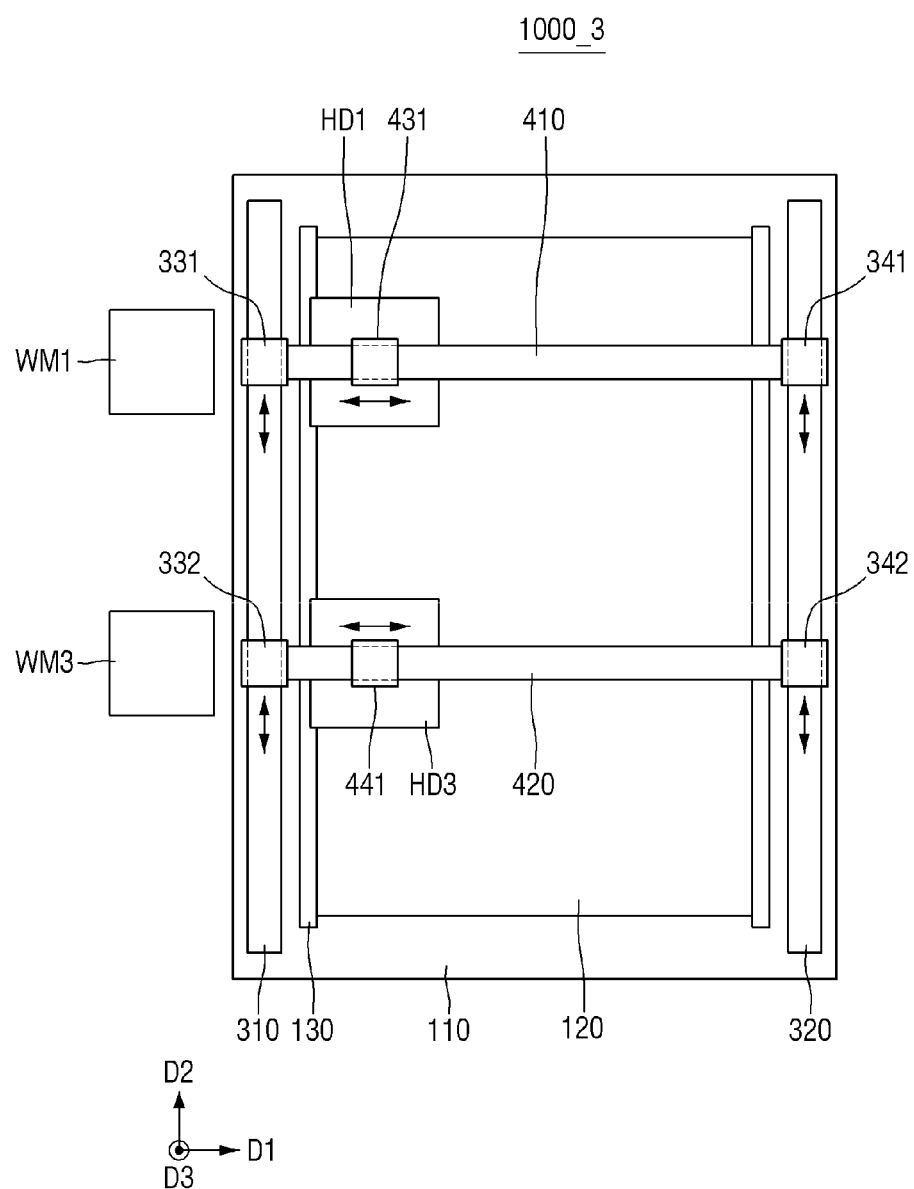
FIG. 22 is a top plan view of a micro device transfer apparatus according to another embodiment.

FIG. 22 is a top plan view of a micro device transfer apparatus 1000_3 according to another embodiment. FIG.

23 is a layout diagram showing relative placement of a plurality of transfer head units and a target substrate of FIG. 22.

Figure 23:
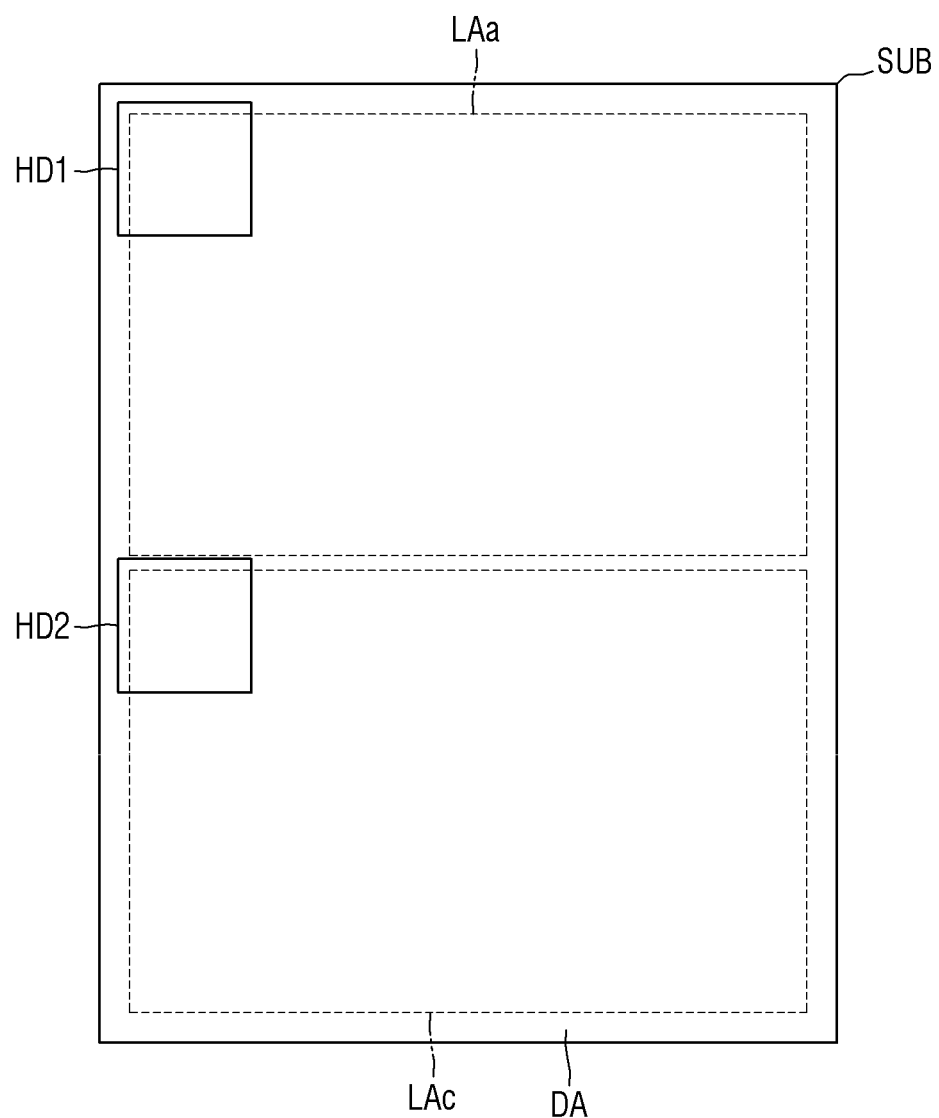
FIG. 23 is a layout diagram showing relative placement of a plurality of transfer head units and a target substrate of FIG. 22.

The embodiment shown in FIGS. 22 and 23 is different from the embodiment shown in FIG. 9 in that one transfer head unit HD is mounted on each of gantry frames 410 and 420. The embodiment shown in FIGS. 22 and 23 will be described, focusing on differences from the embodiment shown in FIGS. 9 and 10.

Referring to FIGS. 22 and 23, one transfer head unit HD may be mounted on each of the gantry frames 410 and 420. Accordingly, the transfer region of the target substrate SUB may be vertically divided, and then each transfer head unit HD may transfer a plurality of micro devices.

Figure 24:
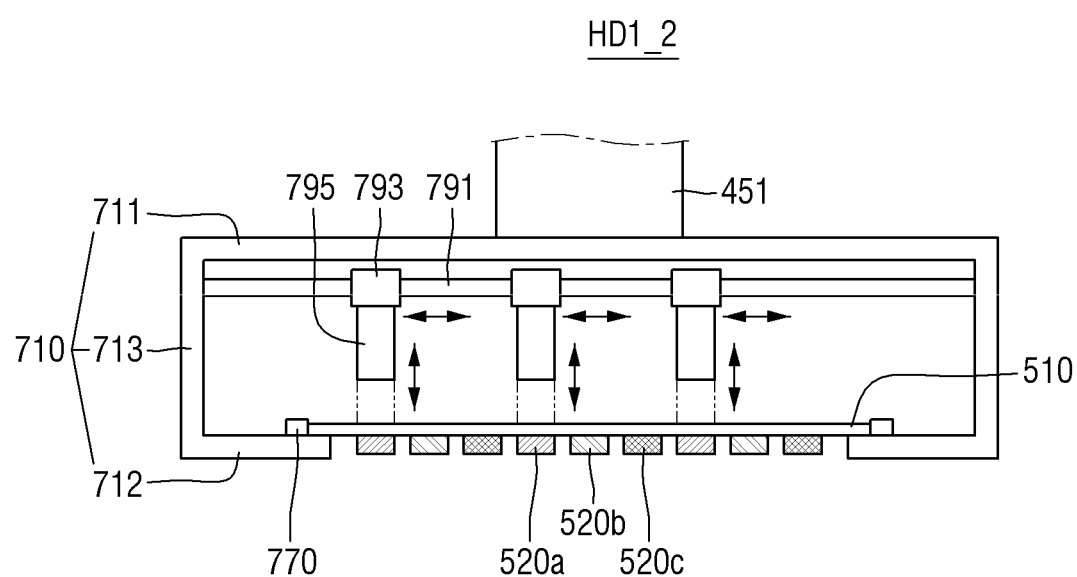
FIG. 24 is a sectional view of a transfer head unit according to another embodiment.

FIG. 24 is a sectional view of a transfer head unit according to another embodiment.

A transfer head unit HD1_2 of FIG. 24 is different from the transfer head unit HD1 of FIG. 6 in that the light emitting part 730 is replaced with a pressure part. The embodiment shown in FIG. 24 will be described, focusing on differences from the embodiment shown in FIG. 6.

Referring to FIG. 24, a carrier substrate 510 of a micro device/carrier substrate laminate 500 provided to the transfer head unit HD1_2 may include a pressure sensitive adhesive. Accordingly, when a vertical pressure stand 795 disposed above the transfer head unit HD1_2 is lowered onto a transferred first micro device 520a to apply pressure to the region of the carrier substrate 510 where the first micro device 520a separated to a first transfer target location is disposed, the first micro device 520a may be separated from the carrier substrate 510 to the first transfer target location.

What is claimed is:

1. A micro device transfer method comprising:
preparing a substrate including a plurality of micro devices attached onto a carrier substrate;
fastening the substrate to a carrier substrate fastening part of a transfer head unit; and
a first separation step of placing a mask unit including an opening part, a mask having a shielding part, and a mask moving module for moving the mask in a first direction at a first location on the substrate and emitting first active light to separate some of the micro devices to which the active light is emitted through the opening part from the carrier substrate.

2. The micro device transfer method of claim 1, further comprising attaching the micro devices separated through the first separation step to a first region of a target substrate.

3. The micro device transfer method of claim 2, further comprising, after the first separation step, a second separation step of placing the mask unit at a second location different from the first location and emitting second active light to separate some of the micro devices to which the active light is emitted through the opening part from the carrier substrate.

4. The micro device transfer method of claim 3, further comprising attaching the micro devices separated through the second separation step to a second region different from the first region of the target substrate.

5. The micro device transfer method of claim 1, wherein,
the substrate further comprises an adhesive film disposed between the carrier substrate and the plurality of micro devices, and
the adhesive film has adhesion weakened by the first active light.

6. The micro device transfer method of claim 1, wherein the transfer head unit comprises a first transfer head unit and a second transfer head unit.

7. The micro device transfer method of claim 1, wherein the transfer head unit is mounted on a gantry frame.

8. A micro device transfer method comprising:
preparing a substrate including a plurality of micro devices attached onto a carrier substrate;
a first separation step of placing a mask unit including an opening part, a mask having a shielding part, and a mask moving module for moving the mask in a first direction at a first location on the substrate and emitting first active light to separate some of the micro devices to which the active light is emitted through the opening part from the carrier substrate; and
before the first separation step, fastening the substrate to a carrier substrate fastening part of a transfer head unit,
wherein the transfer head unit is mounted on a gantry frame, and
wherein after the first separation step, the transfer head unit is moved from a first region of a target substrate on which the first separation step is performed to a second region different from the first region along the gantry frame.

* * * * *